US012738188B2

(12) United States Patent
Lee et al.

(10) Patent No.: US 12,738,188 B2
(45) Date of Patent: Sep. 15, 2026

(54) DISPLAY PANEL

(71) Applicant: Samsung Display Co., Ltd., Yongin-si (KR)

(72) Inventors: Sangshin Lee, Yongin-si (KR); Yeonju Kang, Yongin-si (KR); Sanghoon Kim, Yongin-si (KR); Jongsung Park, Yongin-si (KR); Seungjin Lee, Yongin-si (KR); Choongyoul Im, Yongin-si (KR); Haseok Jeon, Yongin-si (KR); Kookhyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/479,648

(22) Filed: Oct. 2, 2023

(65) Prior Publication Data

US 2024/0135852 A1 Apr. 25, 2024
US 2024/0233596 A9 Jul. 11, 2024

(30) Foreign Application Priority Data

Oct. 25, 2022 (KR) ........................ 10-2022-0138458

(51) Int. Cl.

*G09G 3/20* (2006.01)
*H10K 59/122* (2023.01)
*H10K 59/35* (2023.01)

(52) U.S. Cl.

CPC ......... *G09G 3/2003* (2013.01); *H10K 59/122* (2023.02); *H10K 59/352* (2023.02); *G09G 2300/0452* (2013.01)

(58) Field of Classification Search

CPC .. H10K 59/352; H10K 59/351; H10K 59/122; H10K 59/353; G09G 3/2003; G09G 3/30; G09G 2300/0452
USPC .................................................... 345/76, 690
See application file for complete search history.

(56) References Cited

U.S. PATENT DOCUMENTS

| | | | | |
|---|---|---|---|---|
| 5,742,129 | A | 4/1998 | Nagayama et al. | |
| 10,840,306 | B2 | 11/2020 | Kim | |
| 10,896,939 | B2 | 1/2021 | Jeon et al. | |
| 11,244,992 | B2 | 2/2022 | Lou et al. | |
| 2012/0147065 | A1* | 6/2012 | Byun | G09G 3/3208 345/77 |
| 2013/0002118 | A1 | 1/2013 | Ko | |
| 2015/0270317 | A1 | 9/2015 | Lee et al. | |
| 2017/0294491 | A1* | 10/2017 | Jo | H10K 59/131 |

(Continued)

FOREIGN PATENT DOCUMENTS

| | | |
|---|---|---|
| CN | 110767708 A | 2/2020 |
| CN | 112436029 A | 3/2021 |

(Continued)

OTHER PUBLICATIONS

European Search Report for EP Application No. 23200554.6 dated Mar. 15, 2024, 9 pages.

*Primary Examiner* — Jimmy H Nguyen

(74) *Attorney, Agent, or Firm* — Womble Bond Dickinson (US) LLP

(57) ABSTRACT

In a display panel, a first emission area corresponding to a first display element, a second emission area corresponding to a second display element, and a third emission area corresponding to a third emission area, which are located in a unit pixel area, have closed curve shapes.

7 Claims, 42 Drawing Sheets

(56) References Cited

U.S. PATENT DOCUMENTS

| | | | |
|---|---|---|---|
| 2020/0251536 A1 | 8/2020 | Zhao et al. | |
| 2020/0357866 A1 | 11/2020 | Zhao et al. | |
| 2021/0175295 A1 | 6/2021 | Lee et al. | |
| 2022/0093697 A1 | 3/2022 | Hong et al. | |
| 2022/0293683 A1* | 9/2022 | Kang | H10K 59/873 |
| 2023/0058293 A1 | 2/2023 | Liu et al. | |

FOREIGN PATENT DOCUMENTS

| | | | |
|---|---|---|---|
| EP | 3836222 | A2 | 6/2021 |
| EP | 3982418 | A1 | 4/2022 |
| JP | 1996-227276 | A | 9/1996 |
| JP | 2016-126860 | A | 7/2016 |
| JP | 2020-013695 | A | 1/2020 |
| KR | 10-2013-0007309 | A1 | 1/2013 |
| KR | 10-1958434 | B1 | 3/2019 |
| KR | 10-2019-0096472 | A | 8/2019 |
| KR | 10-2020-0083620 | A | 7/2020 |
| KR | 10-2021-0074177 | A | 6/2021 |
| KR | 10-2022-0041285 | A | 4/2022 |
| KR | 10-2022-0129146 | A | 9/2022 |
| WO | WO 2022/001327 | A1 | 1/2022 |

* cited by examiner

DISPLAY PANEL

CROSS-REFERENCE TO RELATED APPLICATION

The present application claims priority to and the benefit of Korean Patent Application No. 10-2022-0138458, filed on Oct. 25, 2022, in the Korean Intellectual Property Office, the entire disclosure of which is incorporated herein by reference.

BACKGROUND

1. Field

Aspects of one or more embodiments relate to a display panel and a display apparatus including the same.

2. Description of the Related Art

Recently, display apparatuses have been used for various purposes. Also, as thicknesses and weights of display apparatuses have decreased, the range of applications of display apparatuses has increased.

As display apparatuses are being used in various ways, there may be various methods for designing the shapes of display apparatuses, and functions linked to or associated with display apparatuses have increased.

The above information disclosed in this Background section is only for enhancement of understanding of the background and therefore the information discussed in this Background section does not necessarily constitute prior art.

SUMMARY

Aspects of one or more embodiments include a display apparatus in which an aperture ratio loss may be minimized or reduced and display quality may be relatively improved. However, the embodiments in the present disclosure are examples, and do not limit the scope of embodiments according to the present disclosure.

Additional aspects will be set forth in part in the description which follows and, in part, will be apparent from the description, or may be learned by practice of the presented embodiments.

According to one or more embodiments, a display panel includes unit pixel area defined in a first direction and a second direction that is perpendicular to the first direction, wherein, in the unit pixel area, a first display element configured to emit light of a first color and a second display element configured to emit light of a second color are located adjacent to each other in the first direction, and a third display element configured to emit light of a third color is located adjacent to the first display element and the second display element in the second direction, wherein a first emission area corresponding to the first display element, a second emission area corresponding to the second display element, and a third emission area corresponding to the third display element have closed curve shapes.

According to some embodiments, the third emission area may include a first sub-emission area and a second sub-emission area that are adjacent to each other in the first direction, wherein the first emission area, the second emission area, and the third emission area have circular shapes.

According to some embodiments, the first emission area, the second emission area, and the third emission area may have non-circular closed curve shapes.

According to some embodiments, the first emission area may have a dumbbell shape extending in the second direction, the second emission area may have an X shape, and the third emission area may have a dumbbell shape extending in the first direction.

According to some embodiments, the first emission area may have a dumbbell shape extending in the second direction, the second emission area may have a quadrangular shape having four curved uneven sides and round corners, and the third emission area may have a shape in which a central portion of a dumbbell shape extending in the first direction has a curved uneven shape.

According to some embodiments, the first color may be red, the second color may be green, and the third color may be blue.

According to some embodiments, the first color may be red, the second color may be blue, and the third color may be green.

According to some embodiments, the first color may be green, the second color may be blue, and the third color may be red.

According to one or more embodiments, a display panel includes a unit pixel area defined in a first direction and a second direction that is perpendicular to the first direction, wherein, in the unit pixel area, a first display element configured to emit light of a first color and a second display element configured to emit light of a second color face each other in a first diagonal direction, and a third display element configured to emit light of a third color includes a first sub-display element and a second sub-display element which face each other in a second diagonal direction, wherein a first emission area corresponding to the first display element, a second emission area corresponding to the second display element, a first sub-emission area corresponding to the first sub-display element, and a second sub-emission area corresponding to the second sub-display element have closed curve shapes.

According to some embodiments, the first emission area, the second emission area, the first sub-emission area, and the second sub-emission area may have circular shapes.

According to some embodiments, the first emission area and the second emission area may have circular shapes, and the first sub-emission area and the second sub-emission area may have elliptical shapes, wherein a direction of a longest diameter of the first sub-emission area and a direction of a longest diameter of the second sub-emission area are perpendicular to each other.

According to some embodiments, the first emission area may have a circular shape, the second emission area may have an X shape, and the first sub-emission area and the second sub-emission area may have circular shapes.

According to some embodiments, the first emission area may have a ring shape, the second emission area may have an X shape, and the first sub-emission area and the second sub-emission area may have circular shapes.

According to some embodiments, the first emission area and the second emission area may have circular shapes, and the first sub-emission area and the second sub-emission area may have peanut shapes, wherein an extending direction of the first sub-emission area and an extending direction of the second sub-emission area are perpendicular to each other.

According to some embodiments, the first color may be red, the second color may be green, and the third color may be blue.

According to some embodiments, the first color may be red, the second color may be blue, and the third color may be green.

According to one or more embodiments, a display panel includes a unit pixel area defined in a first direction and a second direction that is perpendicular to the first direction, wherein, in the unit pixel area, a first display element configured to emit light of a first color, a second display element configured to emit light of a second color, and a third display element configured to emit light of a third color are arranged in a diagonal direction, wherein a first emission area corresponding to the first display element, a second emission area corresponding to the second display element, and a third emission area corresponding to the third display element have closed curve shapes.

According to some embodiments, the first emission area may have an arc shape, the second emission area may have a peanut shape, and the third emission area may have a circular shape.

According to some embodiments, the first emission area and the second emission area may have arc shapes, and the third emission area may have a circular shape.

According to some embodiments, an arc center of the first emission area and an arc center of the second emission area may be same.

According to some embodiments, an arc center of the first emission area and an arc center of the second emission area may be different from each other.

According to some embodiments, a virtual straight line connecting a center of the first emission area to an arc center of the first emission area may pass through a center of the third emission area adjacent to the first emission area.

According to some embodiments, a virtual straight line connecting a center of the second emission area to an arc center of the second emission area may pass through a center of the third emission area adjacent to the first emission area.

According to some embodiments, a virtual straight line connecting a center of the second emission area to an arc center of the second emission area may pass through a center of the third emission area adjacent to the second emission area.

According to some embodiments, in the unit pixel area, the first display element and the second display element may face each other in a first diagonal direction, and the third display element may be located adjacent to the first display element and the second display element in a second diagonal direction.

According to some embodiments, in the unit pixel area, the first display element, the second display element, and the third display area may be sequentially located adjacent to each other in the diagonal direction.

According to some embodiments, the unit pixel area may include a first unit pixel area and a second unit pixel area, wherein, in the first unit pixel area, the first display element and the second display element face each other in a first diagonal direction, and the third display element is located adjacent to the first display element and the second display element in a second diagonal direction, and in the second unit pixel area, the first display element, the second display element, and the third display element are sequentially located adjacent to each other in the second diagonal direction.

According to some embodiments, the first color may be red, the second color may be green, and the third color may be blue.

According to some embodiments, the first color may be red, the second color may be blue, and the third color may be green.

According to one or more embodiments, a display panel includes a unit pixel area defined in a first direction and a second direction that is perpendicular to the first direction, wherein, in the unit pixel area, a first display element configured to emit light of a first color, a second display element configured to emit light of a second color, and a third display element configured to emit light of a third color are arranged according to certain rules, wherein a first emission area corresponding to the first display element, a second emission area corresponding to the second display element, and a third emission area corresponding to the third display element have closed curve shapes.

According to some embodiments, one of the first display element, the second display element, and the third display element may include a first sub-display element and a second sub-display element, wherein a first sub-emission area corresponding to the first sub-display element and a second sub-emission area corresponding to the second sub-display element are adjacent to each other in the first direction or a diagonal direction.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
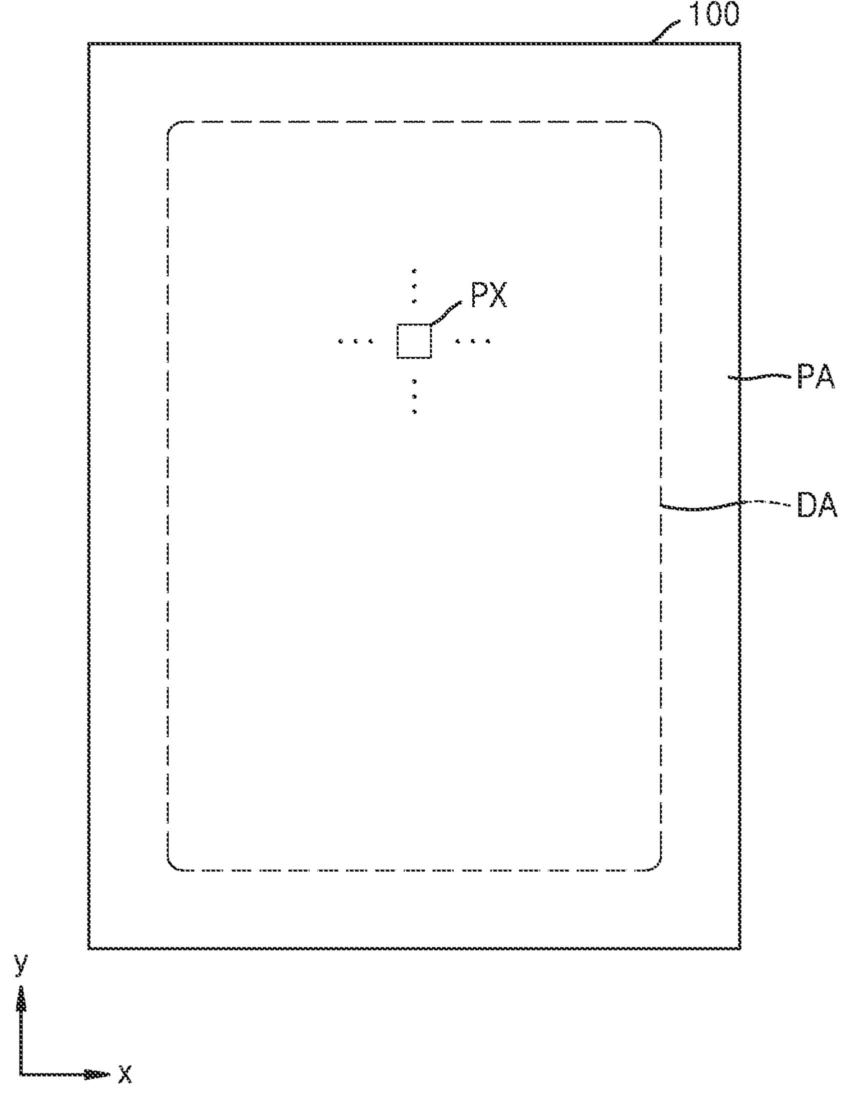
FIG. 1 is a plan view schematically illustrating a display apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or element is referred to as being "on" another layer, region, or element, it may be directly on the other layer, region, or element, or may be indirectly on the other layer, region, or element with intervening layers, regions, or elements therebetween.

Sizes of elements in the drawings may be exaggerated or contracted for convenience of explanation. For example, because sizes and thicknesses of elements in the drawings are arbitrarily illustrated for convenience of explanation, the disclosure is not limited thereto.

"A and/or B" is used herein to select only A, select only B, or select both A and B. Also, "at least one of A and B" is used herein to select only A, select only B, or select both A and B.

In the following embodiments, when a wiring "extends in a first direction or a second direction," it may mean that the wiring extends not only in a linear shape but also in a zigzag or curved shape in the first direction or the second direction.

In the following embodiments, "a plan view of an object" refers to "a view of an object seen from above, and "a cross-sectional view of an object" refers to "a view of an object vertically cut and seen from the side. In the following embodiments, when a first element "overlaps" a second element, it means that the first element is located over or under the second element.

Figure 2:
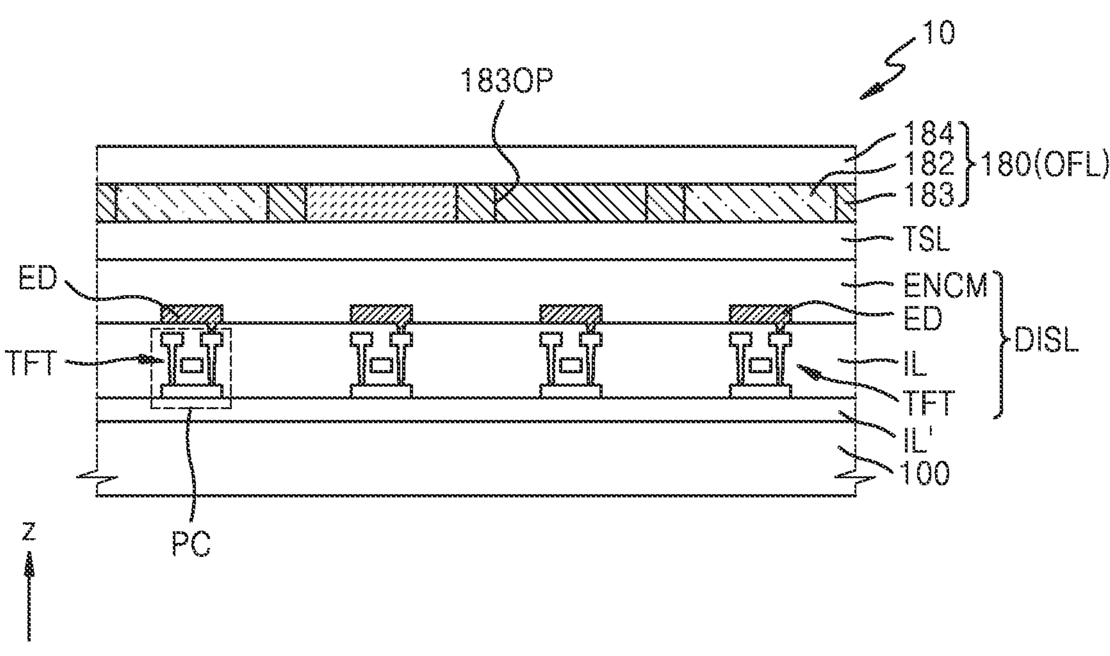
FIGS. 2 to 4 are cross-sectional views schematically illustrating a part of a display apparatus, according to some embodiments.
Figure 3:
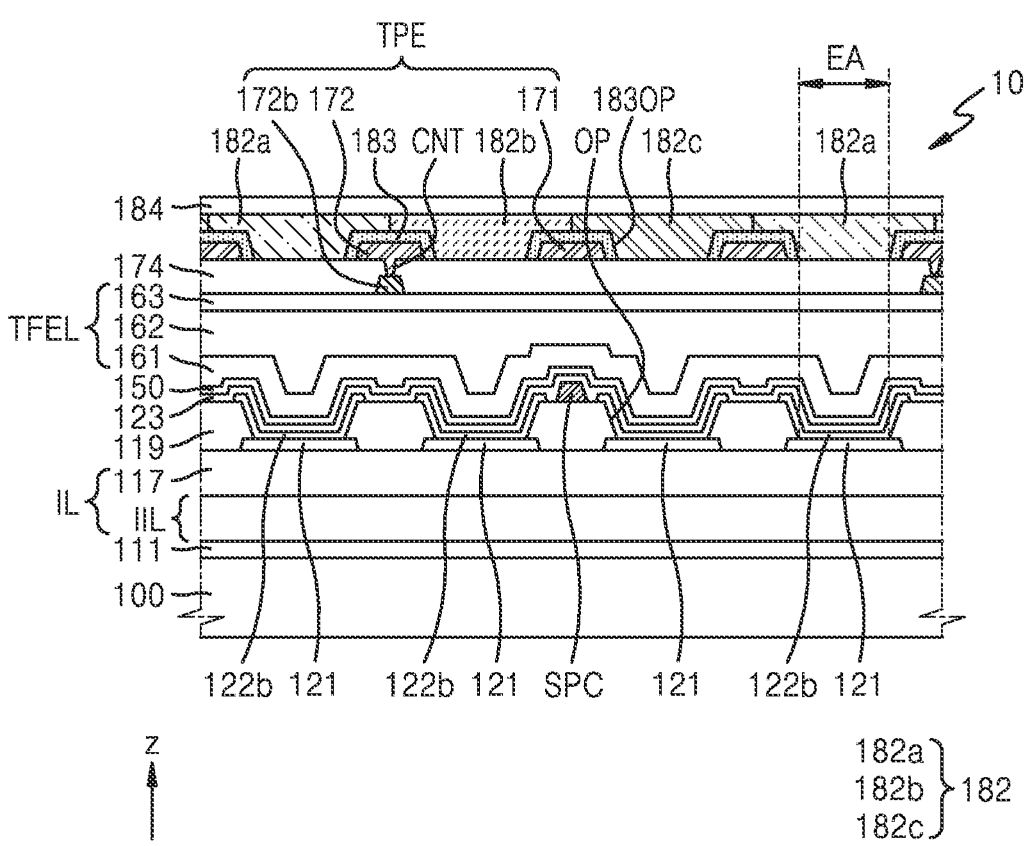
Figure 4:
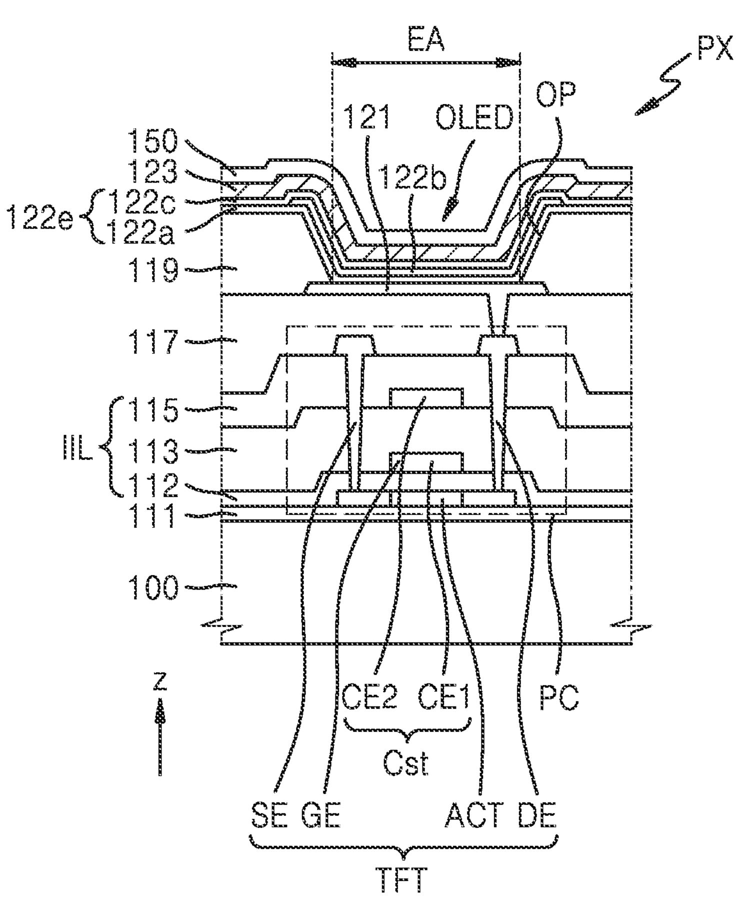

FIG. 1 is a plan view schematically illustrating a display apparatus, according to some embodiments. FIGS. 2 to 4 are cross-sectional views schematically illustrating a part of a display apparatus, according to some embodiments.

Referring to FIGS. 1 to 4, a display apparatus may include a display panel 10, and a cover window for protecting the display panel 10 may be further located on the display panel 10.

The display panel 10 may include a display area DA where images are displayed and a peripheral area PA outside (e.g., in a periphery or outside a footprint of) the display area DA. The peripheral area PA may be a non-display area where pixels PX are not located. The display area DA may be entirely surrounded by the peripheral area PA. Various elements constituting the display panel 10 are located on a substrate 100. Accordingly, the substrate 100 may include the display area DA and the peripheral area PA.

A plurality of pixels PX may be located in the display area DA. The pixel PX may include a display element. The display element may be connected to a pixel circuit for driving the pixel PX. According to some embodiments, the display element may be an organic light-emitting diode OLED. Each pixel PX may emit, for example, red, green, blue, or white light, through the organic light-emitting diode OLED.

In a plan view, the display area DA may have a rectangular shape as shown in FIG. 1. According to some embodiments, the display area DA may have a polygonal shape (e.g., a triangular shape, a pentagonal shape, or a hexagonal shape), a circular shape, an elliptical shape, or an irregular shape.

The peripheral area PA located around the display area DA may be an area where images are not displayed. Various wirings for transmitting electric signals to be applied to the display area DA, outer circuits electrically connected to pixel circuits, and pads to which a printed circuit board or a driver integrated circuit (IC) chip is attached may be located in the peripheral area PA.

Referring to FIGS. 2 and 3, the display panel 10 may include the substrate 100, and a display layer DISL, a touchscreen layer TSL, and an optical functional layer OFL on the substrate 100.

The display layer DISL may include a pixel circuit PC including a thin-film transistor TFT, a light-emitting element ED as a display element, and a sealing member ENCM such as a thin-film encapsulation layer TFEL or a sealing substrate. Insulating layers IL and IL' may be located between the substrate 100 and the display layer DISL, and in the display layer DISL. In FIG. 3, for convenience of illustration, the pixel circuit PC is not shown. Referring to FIGS. 2 and 3, the insulating layer IL' may include a buffer layer 111, and the insulating layers IL may include an inorganic insulating layer IIL, and a planarization layer 117.

The substrate 100 may be a single layer including a glass material. Alternatively, the substrate 100 may include a polymer resin. The substrate 100 including a polymer resin may have a multi-layer structure in which an organic layer including a polymer resin and an inorganic layer are stacked. The substrate 100 may be a rigid substrate, or a flexible substrate that is bendable, foldable, or rollable.

A buffer layer 111, an inorganic insulating layer IIL, and a planarization layer 117 may be sequentially stacked on the substrate 100. The planarization layer 117 may include an organic material or an inorganic material, and may have a single or multi-layer structure. The pixel circuit PC may be located between the buffer layer 111 and the planarization layer 117. As shown in FIG. 4, the pixel circuit PC may include a thin-film transistor TFT and a capacitor Cst.

The thin-film transistor TFT may include a semiconductor layer ACT including amorphous silicon, polycrystalline silicon, an organic semiconductor material, or an oxide semiconductor material, a gate electrode GE, a source electrode SE, and a drain electrode DE. The capacitor Cst may include a lower electrode CE1 and an upper electrode CE2.

The semiconductor layer ACT may be located on the buffer layer 111. A first insulating layer 112 may be located between the semiconductor layer ACT and the gate electrode GE. A second insulating layer 113 may be located on the gate electrode GE, and the upper electrode CE2 of the capacitor Cst may be located on the second insulating layer 113. The upper electrode CE2 may overlap the gate electrode GE that is located below the upper electrode CE2. The gate electrode GE and the upper electrode CE2 overlapping the gate electrode GE with the second insulating layer 113 therebetween may constitute the capacitor Cst. The gate electrode GE may be the lower electrode CE1 of the capacitor Cst. A third insulating layer 115 may be located on the capacitor Cst, and the source electrode SE and the drain electrode DE may be located on the third insulating layer 115.

Each of the first insulating layer 112, the second insulating layer 113, and the third insulating layer 115 may include an inorganic material such as silicon oxide, silicon nitride, and/or silicon oxynitride. The first insulating layer 112, the second insulating layer 113, and the third insulating layer 115 may be collectively referred to as an inorganic insulating layer IIL.

The buffer layer 111 including an inorganic material such as silicon oxide, silicon nitride, and/or silicon oxynitride may be located between the thin-film transistor TFT and the substrate 100.

The planarization layer 117 may be located on the thin-film transistor TFT. The planarization layer 117 may be formed of an organic insulating material such as acryl, benzocyclobutene (BCB), or hexamethyldisiloxane (HMDSO). The planarization layer 117 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$ which may include ZnO and/or $ZnO_2$). When the planarization layer 117 is formed, a layer may be formed and then chemical mechanical polishing may be performed on a top surface of the layer in order to provide a flat top surface. The planarization layer 117 may have a single or multi-layer structure.

An organic light-emitting diode OLED that is a display element may be located as the light-emitting element ED on the planarization layer 117. The organic light-emitting diode OLED may include a pixel electrode 121, a counter electrode 123, and an intermediate layer between the pixel electrode 121 and the counter electrode 123.

The pixel electrode 121 may be located on the planarization layer 117, and the pixel electrode 121 may contact the source electrode SE or the drain electrode DE through a via hole of the planarization layer 117 to be electrically connected to the thin-film transistor TFT.

A pixel-defining layer 119 may be located on the planarization layer 117. The pixel-defining layer 119 may cover an edge of the pixel electrode 121 and may have an opening OP through which a part of the pixel electrode 121 is exposed. A size and a shape of an emission area EA of the organic light-emitting diode OLED may be defined by the opening OP.

The pixel-defining layer 119 may include a transparent insulating material or an opaque insulating material. According to some embodiments, the pixel-defining layer 119 may include an organic insulating material such as polyimide, polyamide, acrylic resin, benzocyclobutene, hexamethyldisiloxane (HMDSO), or phenolic resin. According to some embodiments, the pixel-defining layer 119 may include an inorganic insulating material such as silicon nitride or silicon oxide, or may include an organic insulating material and an inorganic insulating material.

As shown in FIG. 3, a spacer SPC may be further provided on the pixel-defining layer 119. According to some embodiments, the spacer SPC and the pixel-defining layer 119 may include the same material. In this case, the pixel-defining layer 119 and the spacer SPC may be formed together in a mask process using a halftone mask, and the spacer SPC may have an island shape protruding by a certain height in a z direction from the pixel-defining layer 119. According to some embodiments, the spacer SPC and the pixel-defining layer 119 may include different materials. In this case, the spacer SPC may be insulating patterns having island shapes located on the pixel-defining layer 119 and spaced apart from each other by a certain interval.

As shown in FIG. 4, the intermediate layer may include an emission layer **122*b* and an organic functional layer 122*e* over and/or under the emission layer 122*b***.

The emission layer **122*b* may be located in the opening OP of the pixel-defining layer 119 to correspond to the pixel electrode 121. The emission layer 122*b*** may include a high molecular weight material or a low molecular weight material, and may emit red light, green light, blue light, or white light.

The organic functional layer **122*e* may include a first functional layer 122*a* and/or a second functional layer 122*c*. The first functional layer 122*a* or the second functional layer 122*c*** may be omitted.

The first functional layer **122*a* may be located under the emission layer 122*b*. The first functional layer 122*a* may have a single or multi-layer structure including an organic material. The first functional layer 122*a* may be a hole transport layer (HTL) having a single-layer structure. Alternatively, the first functional layer 122*a* may include a hole injection layer (HIL) and a hole transport layer (HTL). The first functional layer 122*a*** may be integrally formed to correspond to the organic light-emitting diodes OLED included in the display area DA.

The second functional layer **122*c* may be located over the emission layer 122*b*. The second functional layer 122*c* may have a single or multi-layer structure including an organic material. The second functional layer 122*c* may include an electron transport layer (ETL) and/or an electron injection layer (EIL). The second functional layer 122*c*** may be integrally formed to correspond to the organic light-emitting diodes OLED included in the display area DA.

The counter electrode 123 may be located on the emission layer **122*b*. An upper layer 150 including an organic material may be located on the counter electrode 123**.

According to some embodiments, the intermediate layer may include two or more light-emitting units that are sequentially stacked between the pixel electrode 121 and the counter electrode 123, and a charge generation layer CGL that is located between the two light-emitting units. When the intermediate layer includes a light-emitting unit and a charge generation layer CGL, the organic light-emitting diode OLED may be a tandem light-emitting element. Because the organic light-emitting diode OLED has a structure in which a plurality of light-emitting units are stacked, color purity and luminous efficiency may be relatively improved.

One light-emitting unit may include an emission layer and a first functional layer and a second functional layer respectively located under and over the emission layer. The charge generation layer CGL may include a negative charge generation layer and a positive charge generation layer. Due to the negative charge generation layer and the positive charge generation layer, the luminous efficiency of the organic light-emitting diode OLED that is a tandem light-emitting element including a plurality of emission layers may be further relatively improved. The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer include a host and a dopant. The host may include an organic material. The dopant may include a metal material.

The upper layer 150 may protect the counter electrode 123 and relatively improve light extraction efficiency. The upper layer 150 may include LiF. Alternatively, the upper layer 150 may additionally include an inorganic insulating material such as silicon oxide ($SiO_x$) or silicon nitride ($SiN_x$).

The display elements may be covered by the thin-film encapsulation layer TFEL. According to some embodiments, the thin-film encapsulation layer TFEL may include at least one inorganic encapsulation layer and at least one organic encapsulation layer. For example, the thin-film encapsulation layer TFEL may include first and second inorganic encapsulation layers 161 and 163 and an organic encapsulation layer 162 between the first and second inorganic encapsulation layers 161 and 163.

The touchscreen layer TSL may be located on the second inorganic encapsulation layer 163. The touchscreen layer TSL may obtain coordinate information according to an external input, for example, a touch event. The touchscreen layer TSL may detect an external input by using a self-capacitive method or a mutual capacitive method. The touchscreen layer TSL may include touch electrodes TPE and wirings connected to the touch electrodes TPE. The touch electrodes TPE may include first touch electrodes 171 and second touch electrodes 172. The first touch electrodes 171 may be connected by connection electrodes located on the same layer. The second touch electrodes 172 may be connected to connection electrodes 172*b* located on a different layer via a contact hole CNT of an insulating layer 174. The touch electrodes TPE may be located to correspond to the pixel-defining layer 119.

The optical functional layer OFL may include a filter layer 180 including a color filter 182, a black matrix 183, and an overcoat layer 184. The black matrix 183 may cover the first touch electrodes 171 and the second touch electrodes 172. The black matrix 183 may be located to correspond to the pixel-defining layer 119. The overcoat layer 184 may include an organic material such as a resin, and the organic material may be transparent.

In the display panel 10 using the color filter 182 and the black matrix 183 as the optical functional layer OFL, instead of a polarizer or a polarizing film, the luminous efficiency of the display element may be relatively improved, power consumption may be reduced, and a luminance may be increased, and thus, a lifetime of the display panel may be increased. Also, the same or higher luminance/lifetime may be ensured even with a smaller area than an existing emission area. And because a polarizer or a polarizing film is not used, a thickness of the display panel may be reduced.

The color filter 182 may include a first color filter 182*a* that selectively transmits only light of a first color, a second color filter 182*b* that selectively transmits only light of a second color, and a third color filter 182*c* that selectively transmits only light of a third color. The first color filter 182*a*, the second color filter 182*b*, and the third color filter 182*c* may be located to correspond to the emission area EA of the pixel PX. The first color filter 182*a*, the second color filter 182*b*, and the third color filter 182*c* may be located adjacent to each other. Each of the first color filter 182*a*, the second color filter 182*b*, and the third color filter 182*c* may have an independent pattern structure. Each of the first color filter 182*a*, the second color filter 182*b*, and the third color filter 182*c* may be located in an opening 1830P of the black matrix 183. Each of the first color filter 182*a*, the second color filter 182*b*, and the third color filter 182*c* may partially overlap the pixel-defining layer 119.

Figure 5A:
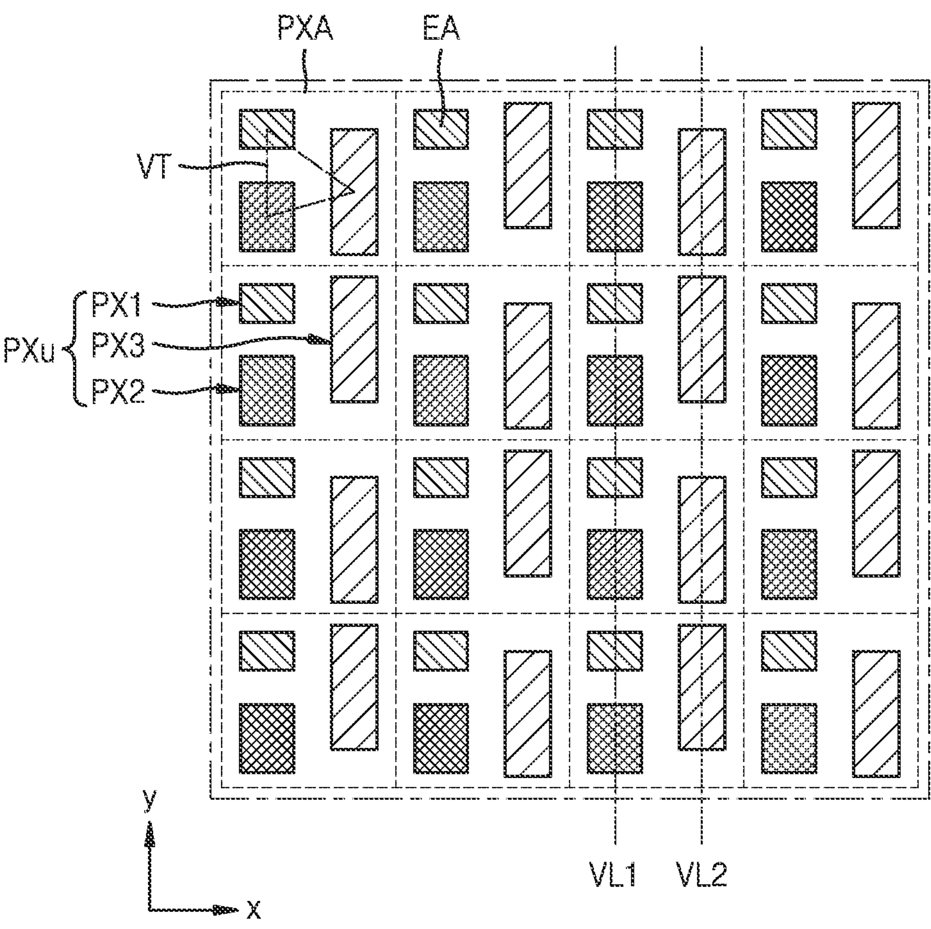
FIGS. 5A and 5B are views illustrating an arrangement of pixels, according to some embodiments.
Figure 5B:
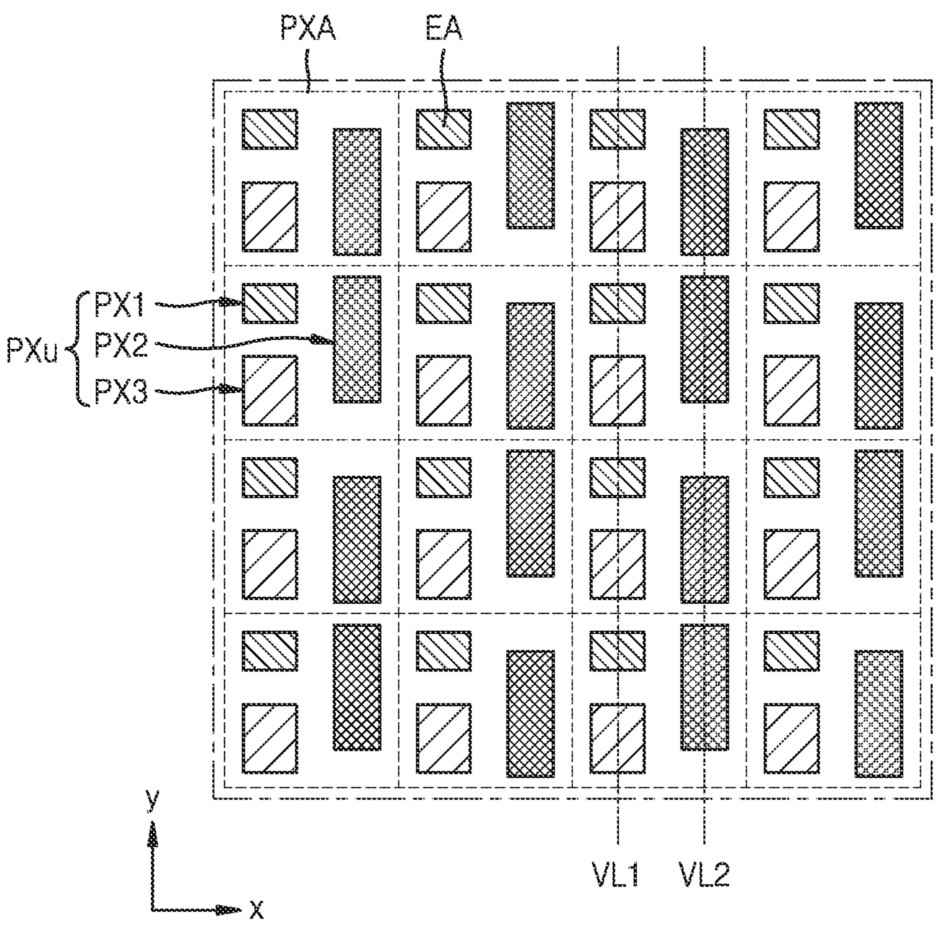

FIGS. 5A and 5B are views illustrating an arrangement of pixels, according to some embodiments.

Unit pixel areas PXA may be defined by an area where an x direction and a y direction intersect in the display area DA of a display panel, and unit pixels PXu may be located in the unit pixel area PXA. The unit pixel PXu may include a first pixel PX1, a second pixel PX2, and a third pixel PX3. According to some embodiments, the first pixel PX1 may be a red pixel emitting red light, the second pixel PX2 may be a green pixel emitting green light, and the third pixel PX3 may be a blue pixel emitting blue light. Each of the first pixel PX1, the second pixel PX2, and the third pixel PX3 may include the organic light-emitting diode OLED that is a display element and a pixel circuit connected to the organic light-emitting diode OLED.

Display elements of the first pixel PX1, the second pixel PX2, and the third pixel PX3 in the unit pixel area PXA may be arranged in a certain pattern according to pre-determined rules. According to some embodiments, the unit pixel area PXA may have a square shape.

A size and a shape of the emission area EA of the organic light-emitting diode OLED is defined by the opening OP of the pixel-defining layer 119, and the emission area EA is an area where an emission layer 122*b* of the organic light-emitting diode OLED is located, with reference to FIG. 4. Accordingly, an arrangement of pixels in the specification may refer to an arrangement of display elements, an arrangement of pixel electrodes, or an arrangement of emission areas. FIGS. 5A and 5B illustrate the emission areas EA corresponding to the organic light-emitting diode of the first pixel PX1, the organic light-emitting diode of the second pixel PX2, and the organic light-emitting diode of the third pixel PX3 located in the unit pixel area PXA.

According to some embodiments, as shown in FIG. 5A, centers of the emission area EA of the first pixel PX1, the emission area EA of the second pixel PX2, and the emission area EA of the third pixel PX3 may be located at vertexes of a virtual triangle VT in the unit pixel area PXA. In the unit pixel area PXA, the emission area EA of the first pixel PX1 and the emission area EA of the second pixel PX2 may be located adjacent to each other in the y direction, and the emission area EA of the third pixel PX3 may be located adjacent to the emission areas EA of the first pixel PX1 and the second pixel PX2 in the x direction. Accordingly, the emission area EA of the first pixel PX1 and the emission area EA of the second pixel PX2 may be alternately arranged in the y direction along a first virtual straight line VL1, and the emission area EA of the third pixel PX3 may be repeatedly arranged in the y direction along a second virtual straight line VL2.

Lengths of the emission area EA of the first pixel PX1, the emission area EA of the second pixel PX2, and the emission area EA of the third pixel PX3 in the x direction and the y direction may be different from each other. For example, the emission area EA of the first pixel PX1 may have a quadrangular shape with a long side in the x direction, and the emission area EA of the second pixel PX2 and the emission area EA of the third pixel PX3 may have a quadrangular shape with a long side in the y direction. A ratio of a length in the x direction and a length in the y direction may be different among the emission area EA of the first pixel PX1, the emission area EA of the second pixel PX2, and the emission area EA of the third pixel PX3.

According to some embodiments, each of the emission area EA of the first pixel PX1 and/or the emission area EA of the second pixel PX2 may have a square shape in which a length in the x direction and a length in the y direction are the same. A length of the emission area EA of the third pixel PX3 in the y direction may be equal to or greater than a sum of a length of the emission area EA of the first pixel PX1 in the y direction and a length of the emission area EA of the second pixel PX2 in the y direction. A quadrangular shape of the emission area EA may include a quadrangular shape with round corners (vertexes) (although embodiments according to the present disclosure are not limited thereto). According to some embodiments, the spacer SPC (see FIG. 3) may be located between the emission areas EA of one pair of third pixels PX3 and the emission areas EA of another pair of third pixels PX3 in the y direction.

The emission area EA of the first pixel PX1, the emission area EA of the second pixel PX2, and the emission area EA of the third pixel PX3 may have different areas (sizes). According to some embodiments, the emission area EA of the third pixel PX3 may have an area greater than that of the emission area EA of the first pixel PX1. Also, the emission area EA of the third pixel PX3 may have an area greater than that of the emission area EA of the second pixel PX2. According to some embodiments, the emission area EA of the second pixel PX2 may have an area greater than that of the emission area EA of the first pixel PX1. According to some embodiments, the emission area EA of the first pixel PX1 may have the same area as that of the emission area EA of the second pixel PX2.

According to some embodiments, as shown in FIG. 5B, locations of the second pixel PX2 and the third pixel PX3 in a pixel arrangement of FIG. 5A may be replaced with each other so that the emission area EA of the first pixel PX1 and the emission area EA of the third pixel PX3 are alternately arranged in the y direction along the first virtual straight line VL1 and the emission area EA of the second pixel PX2 is repeatedly arranged in the y direction along the second virtual straight line VL2. In this case, a length of the emission area EA of the second pixel PX2 in the y direction may be equal to or greater than a sum of a length of the emission area EA of the first pixel PX1 in the y direction and a length of the emission area EA of the third pixel PX3 in the y direction.

Figure 6A:
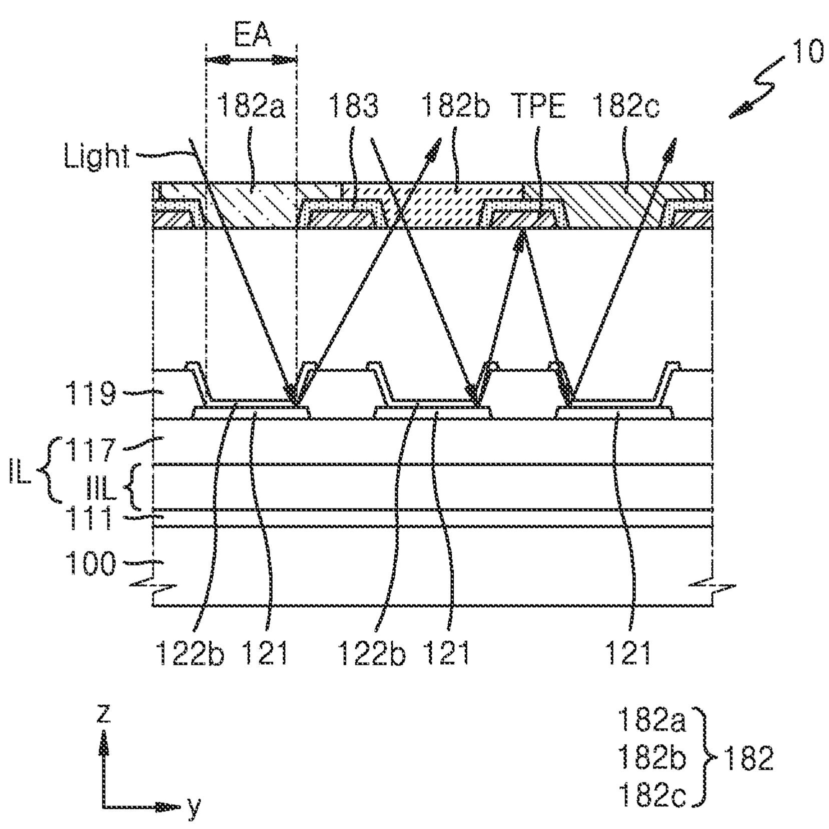
FIGS. 6A and 6B are views for describing reflection of light from an external light source, according to some embodiments.
Figure 6B:
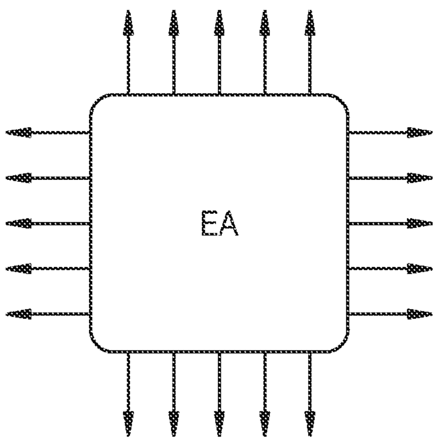

FIGS. 6A and 6B are views for describing reflection of light by an external light source. In FIG. 6A, for convenience of illustration and explanation, some elements may not be shown.

Referring to FIGS. 6A and 6B, when a shape of an emission area has a polygonal shape including straight sides as shown in FIGS. 5A and 5B and light is incident on a display panel in a black state, due to diffuse reflection at an edge of a straight pixel-defining layer, linear reflective color bands and diffraction may occur along the edge of the pixel-defining layer or the emission area.

Figure 7A:
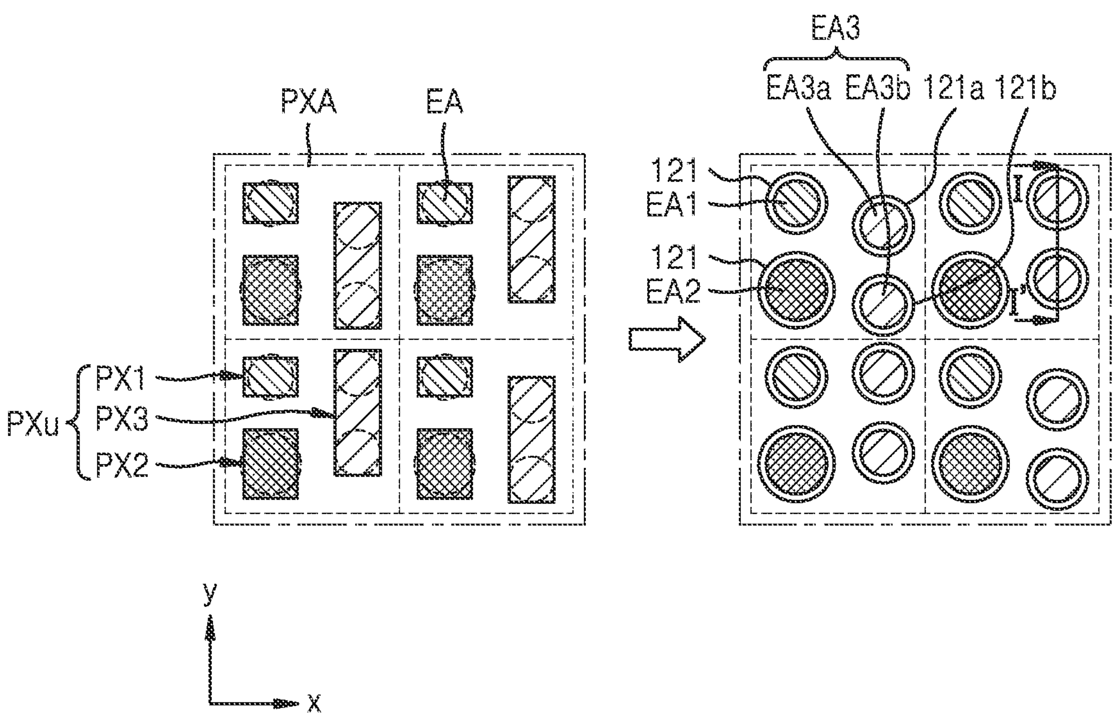
FIGS. 7A and 7B are views illustrating an emission area, according to some embodiments.
Figure 7B:
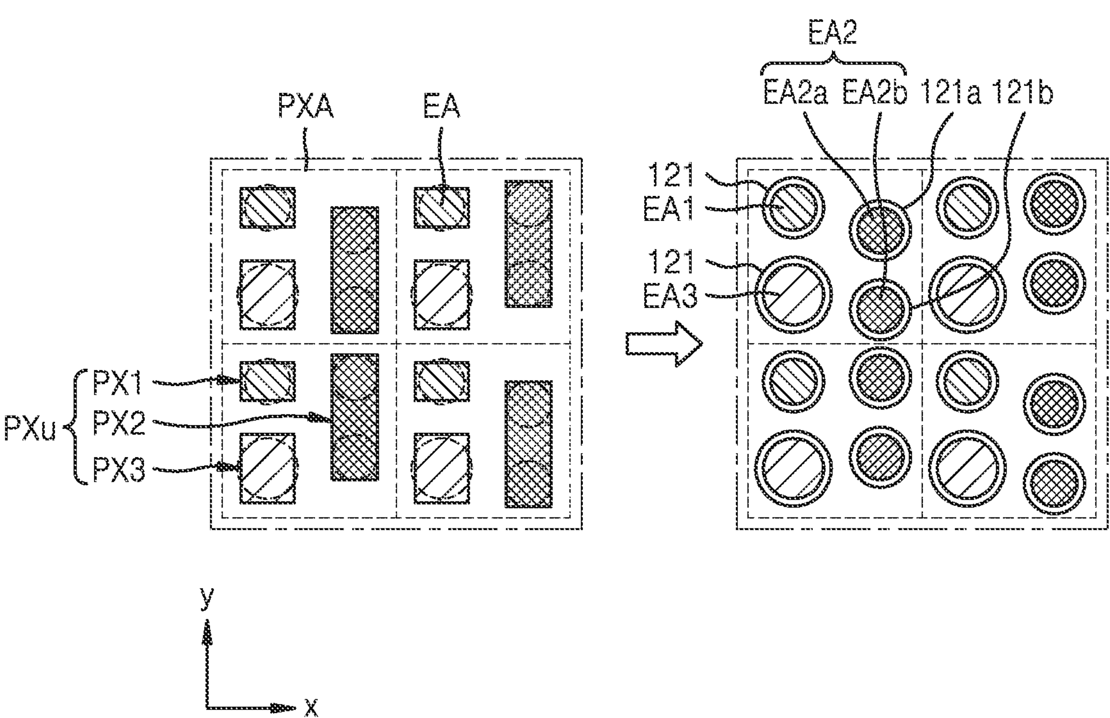
Figure 7C:
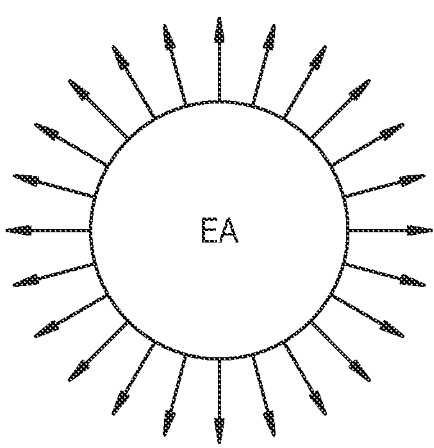
FIG. 7C is a view for describing reflection of light from an external light source, according to some embodiments.
Figure 8:
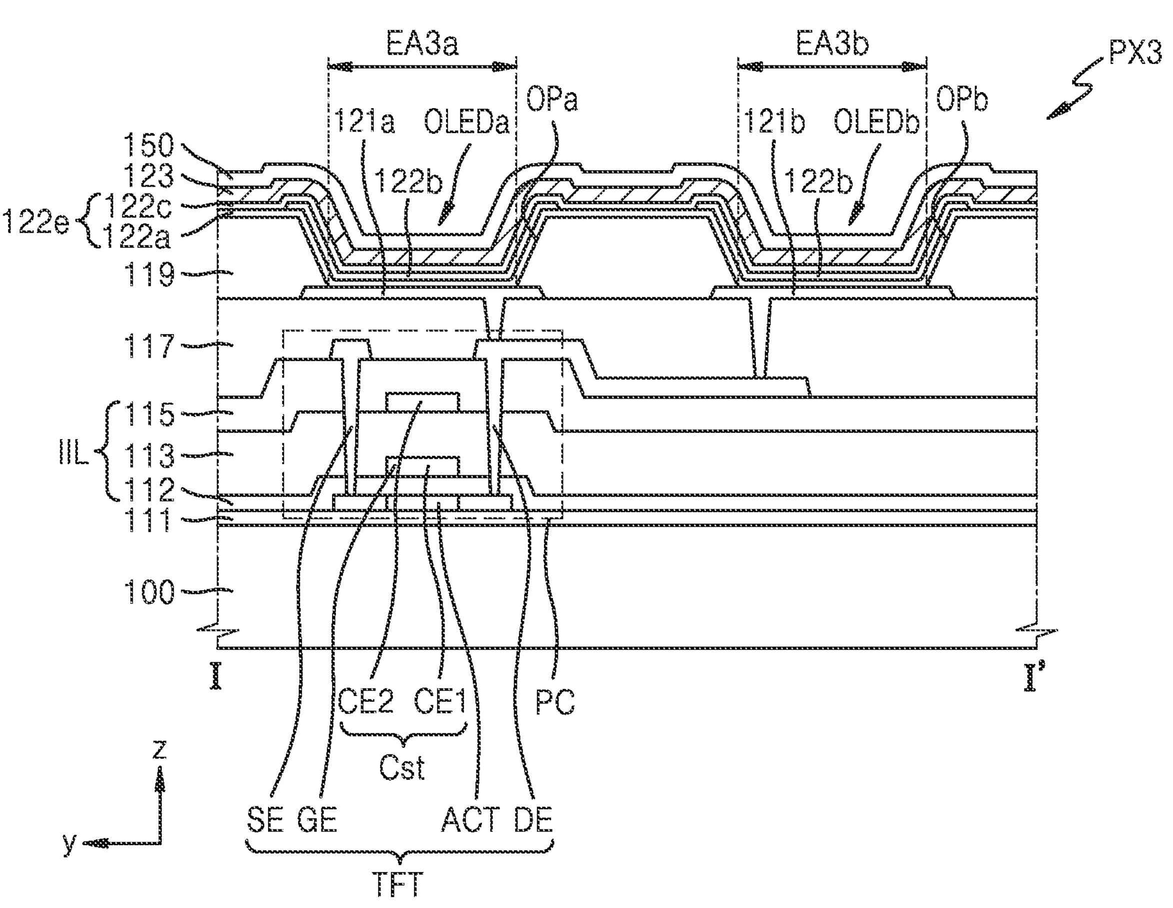
FIGS. 8 and 9 are cross-sectional views taken along the line I-I' of FIG. 7A, according to some embodiments.
Figure 9:
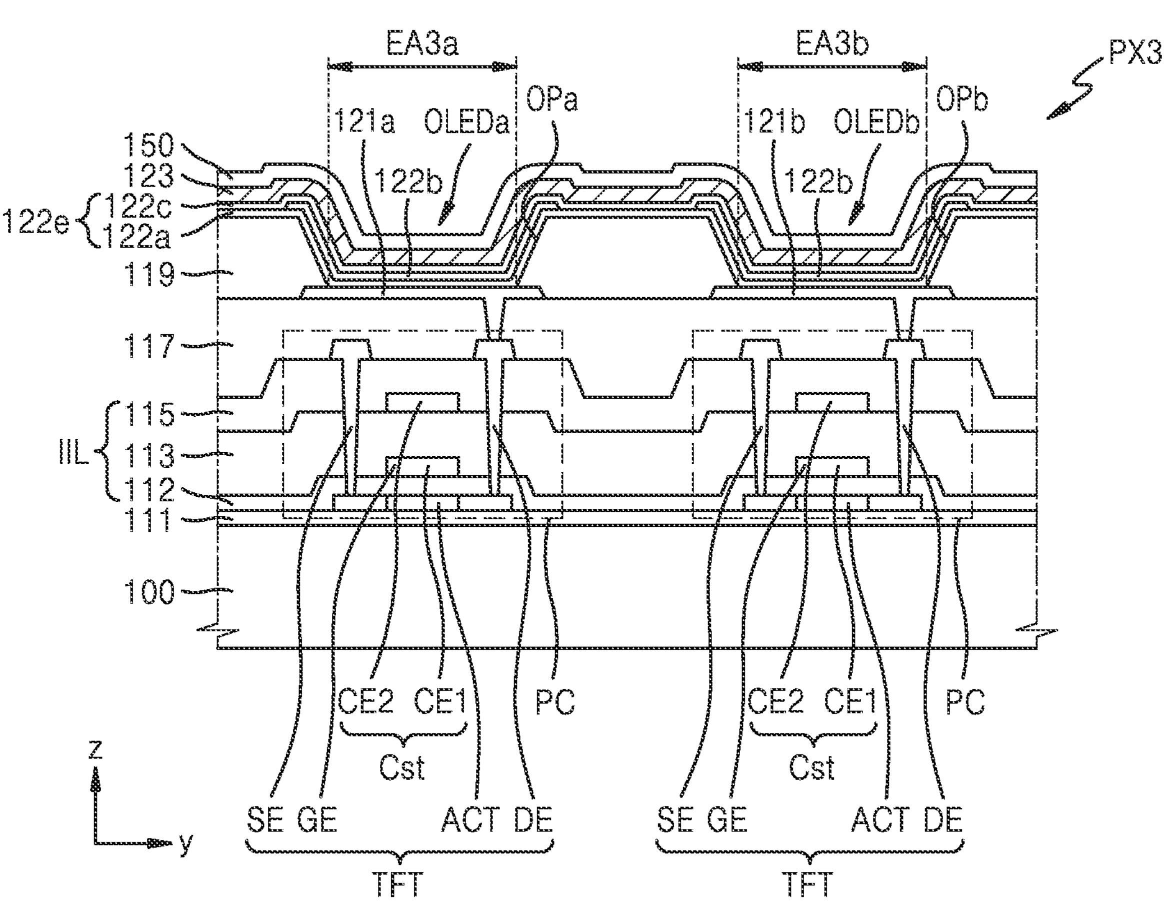

FIGS. 7A and 7B are views illustrating an emission area, according to some embodiments. FIG. 7C is a view for describing reflection of light from an external light source. FIGS. 8 and 9 are a cross-sectional views taken along the line I-I' of FIG. 7A.

According to some embodiments, an organic light-emitting diode of the first pixel PX1, an organic light-emitting diode of the second pixel PX2, and an organic light-emitting diode of the third pixel PX3 may be located in the unit pixel area PXA, and each of a first emission area EA1 corresponding to the organic light-emitting diode of the first pixel PX1, a second emission area EA2 corresponding to the organic light-emitting diode of the second pixel PX2, and a third emission area EA3 corresponding to the organic light-emitting diode of the third pixel PX3 may have a circular shape.

Referring to FIG. 7A, each of the first emission area EA1 of the first pixel PX1 and the second emission area EA2 of the second pixel PX2 having a quadrangular shape may be changed into a circular emission area. A radius of the second emission area EA2 of the second pixel PX2 may be greater than a radius of the first emission area EA1 of the first pixel PX1. The third emission area EA3 of the third pixel PX3 having a rectangular shape with a long side in the y direction may be changed into one pair of circular sub-emission areas EA3*a* and EA3*b* that are adjacent to each other in the y direction.

Accordingly, in the unit pixel area PXA, the first emission area EA1 of the first pixel PX1 and the sub-emission area EA3*b* of the third pixel PX3 may face each other in a diagonal direction, and the second emission area EA2 of the second pixel PX2 and the sub-emission area EA3*a* of the third pixel PX3 may face each other in another diagonal direction. The pair of circular sub-emission areas EA3*a* and EA3*b* may have the same radius. A radius of each of the pair of circular sub-emission areas EA3*a* and EA3*b* of the third pixel PX3 may be the same as a radius of the first emission area EA1 of the first pixel PX1.

Each of the first pixel PX1, the second pixel PX2, and the third pixel PX3 may include the organic light-emitting diode OLED, and the pixel electrode 121 of the organic light-emitting diode OLED may be located on the planarization layer 117. Each of the pixel electrodes 121 of the first pixel PX1, the second pixel PX2, and the third pixel PX3 may have a shape that is the same as or similar to that of a corresponding emission area. For example, the pixel electrode 121 of the first pixel PX1 may have a circular shape with a radius greater than that of the first emission area EA1, and the pixel electrode 121 of the second pixel PX2 may have a circular shape with a radius greater than that of the second emission area EA2. The organic light-emitting diode OLED of the third pixel PX3 may include one pair of sub-organic light-emitting diodes OLEDa and OLEDb. The pixel electrode 121 of the third pixel PX3 may include one pair of pixel electrodes 121*a* and 121*b* respectively corresponding to the pair of circular sub-emission areas EA3*a* and EA3*b*. Each of the pair of pixel electrodes 121*a* and 121*b* may have a circular shape with a radius greater than that of each of the circular emission areas EA3*a* and EA3*b*.

Each of the pixel electrodes 121*a* and 121*b* of the third pixel PX3 may contact the source electrode SE or the drain electrode DE through a via hole of the planarization layer 117 to be electrically connected to the thin-film transistor TFT. FIG. 8 illustrates an example where each of the pixel electrodes 121*a* and 121*b* of the third pixel PX3 is connected to the drain electrode DE or an extending portion of the drain electrode DE. The pixel-defining layer 119 may cover edges of one pair of pixel electrodes 121*a* and 121*b* of the third pixel PX3, and openings OPa and OPb corresponding to portions of the pixel electrodes 121*a* and 121*b* may be defined in the pixel-defining layer 119. The intermediate layer including the emission layer 122*b* and the counter electrode 123 may be located in the openings OPa and OPb of the pixel-defining layer 119. As shown in FIG. 8, one pair of sub-organic light-emitting diodes OLEDa and OLEDb may be driven by one pixel circuit PC. According to some embodiments, as shown in FIG. 9, each of one pair of sub-organic light-emitting diodes OLEDa and OLEDb may be driven by a corresponding pixel circuit PC.

According to some embodiments, as shown in FIG. 7B, locations of the second pixel PX2 and the third pixel PX3 in a pixel arrangement of FIG. 7A may be replaced with each other. The third emission area EA3 of the third pixel PX3 and the first emission area EA1 of the first pixel PX1 may be alternately arranged in the y direction, and the second emission area EA2 of the second pixel PX2 may include one pair of circular sub-emission areas EA2*a* and EA2*b* that have the same radius and are adjacent to each other in the y direction.

As shown in FIGS. 7A and 7B, because an emission area having a quadrangular shape is changed into an emission area having a circular shape, during diffuse reflection due to incident external light, as shown in FIG. 7C, reflective color bands and diffraction may be minimized through uniform diffraction for each azimuth angle. In this case, the size and the number of circular emission areas of each pixel may be determined by considering an aperture ratio of a quadrangular emission area of each pixel.

FIGS. 10A to 19 are views illustrating an emission area, according to some embodiments.

When a display panel uses a color filter and a black matrix as an optical functional layer, due to color filter characteristics, required aperture ratios of pixels emitting light of different colors may need to be different. For example, in the display panel, as shown in FIG. 5A, an aperture ratio may increase in the order of the first pixel PX1, the second pixel PX2, and the third pixel PX3, or as shown in FIG. 5B, an aperture ratio may increase in the order of the first pixel PX1, the third pixel PX3, and the second pixel PX2. In a display panel having a pixel arrangement with a variable aperture ratio between pixels, when a rectangular emission area is changed into a circular emission area, an aperture ratio may be lost. Embodiments of FIGS. 10A to 19 are various modifications of an emission area that may minimize an aperture ratio loss in a pixel arrangement of FIGS. 5A and 5B. In embodiments of FIGS. 10A to 19, shapes of emission areas of the first pixel PX1, the second pixel PX2, and the third pixel PX3 may be the same or different from each other.

According to some embodiments, an emission area may have a non-circular closed curve shape (although embodiments are not limited thereto). The closed curve shape may have a plurality of curves. As the number of curves increases, an aperture ratio may increase. For example, as shown in FIGS. 10A to 11B, in a pixel arrangement of FIGS. 5A and 5B, a rectangular emission area with a long side in the x direction or the y direction may be changed into an emission area having a dumbbell (or peanut)-shaped closed curve shape, and a square emission area may be changed into an emission area having an X-shaped closed curve shape.

Figure 10A:
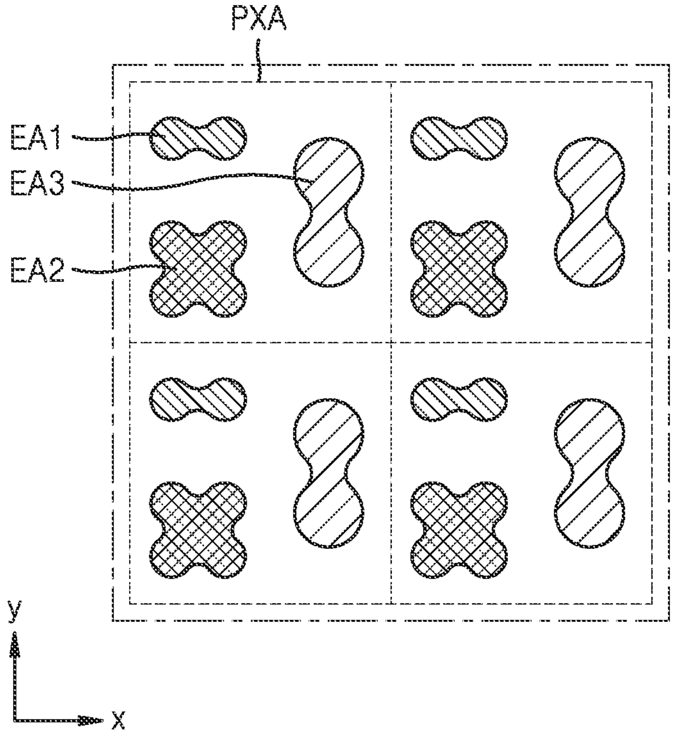
FIGS. 10A to 19 are views illustrating an emission area, according to some embodiments.
Figure 10B:
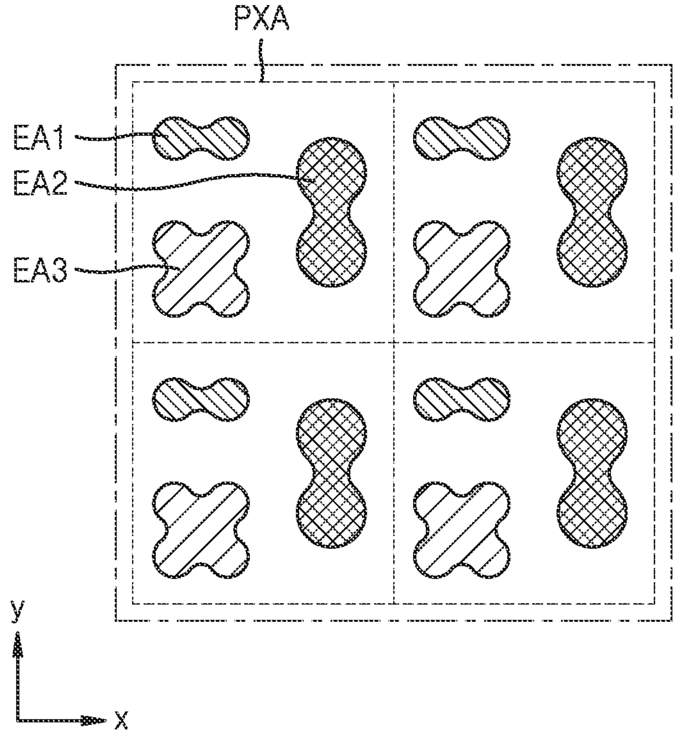

Referring to FIG. 10A, the first emission area EA1 of the first pixel PX1 may have a dumbbell-shaped closed curve shape extending in the x direction and having a concave center. The third emission area EA3 of the third pixel PX3 may have a dumbbell-shaped closed curve shape extending in the y direction and having a concave center. The second emission area EA2 of the second pixel PX2 may have an X-shaped closed curve shape having four convex portions that protrude from the center in two diagonal directions that intersect each other at the center. FIG. 10B illustrates an example where locations of the second emission area EA2 of the second pixel PX2 and the third emission area EA3 of the third pixel PX3 are changed with each other. The first emission area EA1 of the first pixel PX1 and the second emission area EA2 of the second pixel PX2 may have dumbbell shapes, and the third emission area EA3 of the third pixel PX3 may have an X shape.

Figure 11A:
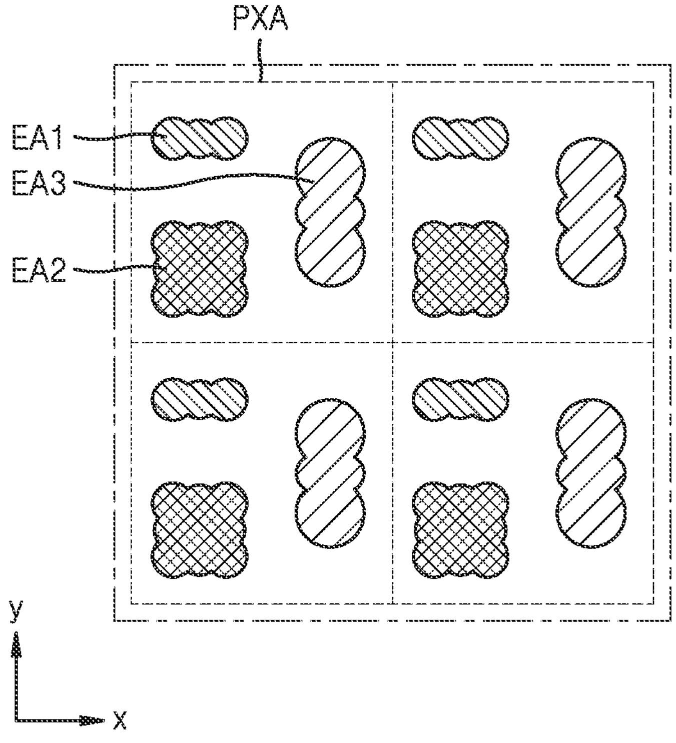
Figure 11B:
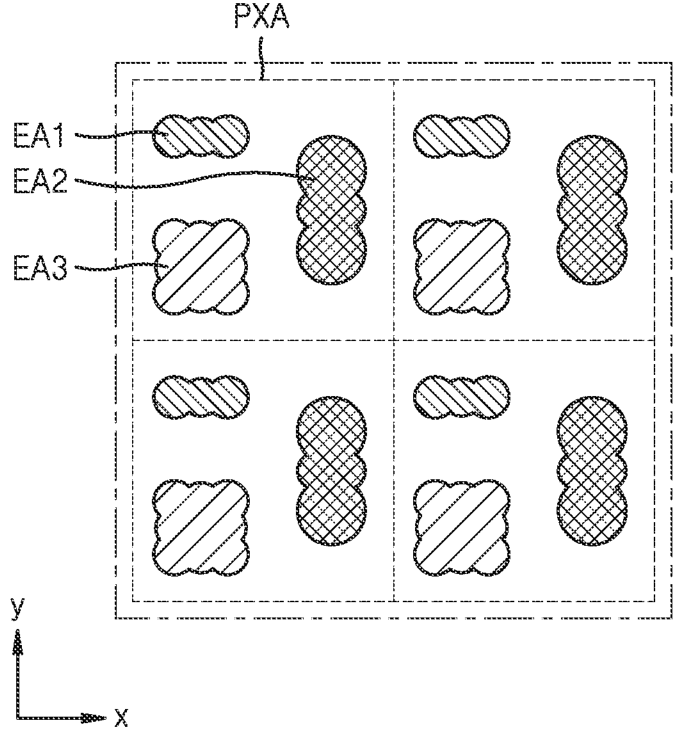

Referring to FIG. 11A, the first emission area EA1 of the first pixel PX1 may have a shape in which a central portion of a dumbbell shape extending in the x direction has a curved uneven shape. Alternatively, the first emission area EA1 of the first pixel PX1 may have a shape in which a concave central portion of a dumbbell shape of FIG. 10A is replaced by a convex central portion. The third emission area EA3 of the third pixel PX3 may have a shape in which a central portion of a dumbbell shape extending in the y direction has a curved uneven shape. Alternatively, the third emission area EA3 of the third pixel PX3 may have a shape in which a concave central portion of a dumbbell shape of FIG. 10A is replaced by a convex central portion. The second emission area EA2 of the second pixel PX2 may have a quadrangular shape having four curved uneven sides and round corners. Alternatively, the second emission area EA2 of the second pixel PX2 may have a shape in which a + shape having four convex portions overlaps an X shape having four convex portions of FIG. 10A. FIG. 11B illustrates an example where locations of the second emission area EA2 of the second pixel PX2 and the third emission area EA3 of the third pixel PX3 in FIG. 11A are changed with each other. The number of curves of emission areas of FIGS. 11A and 11B may be greater than the number of curves of emission areas of FIGS. 10A and 10B.

Figure 12A:
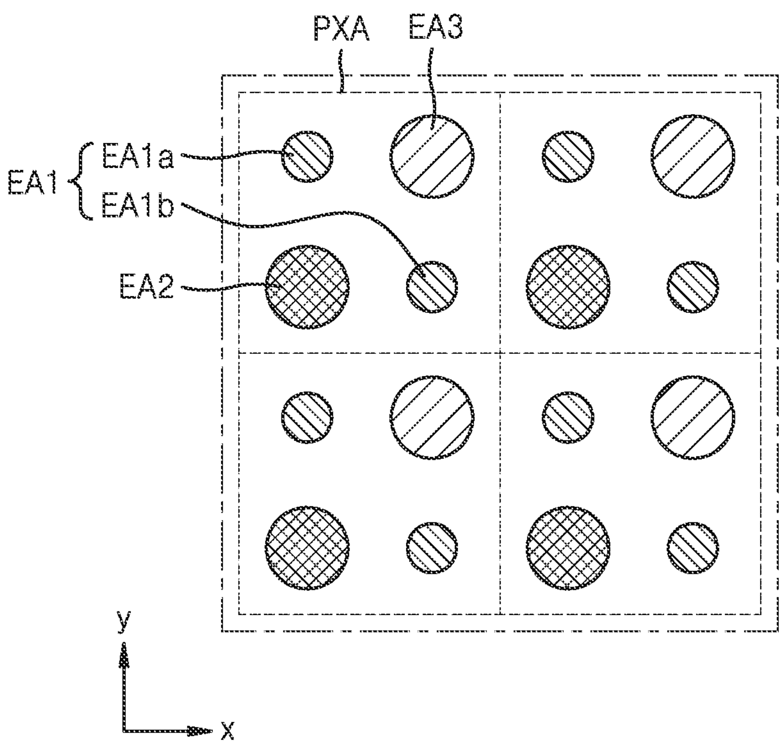

In embodiments of FIGS. 12A to 19, one of the first to third emission areas EA1, EA2, and EA3 of the first to third pixels PX1, PX2, and PX3 located in the unit pixel area PXA includes one pair of sub-emission areas. For example, as shown in FIG. 12A, the first emission area EA1 of the first pixel PX1 may include one pair of sub-emission areas EA1*a* and EA1*b*. Alternatively, as shown in FIG. 12B, the second emission area EA2 of the second pixel PX2 may include one pair of sub-emission areas EA2*a* and EA2*b*. According to some embodiments, the third emission area EA3 of the third pixel PX3 may include one pair of sub-emission areas. Embodiments of FIGS. 12A to 19 are various modifications of an emission area that may minimize an aperture ratio loss in a pixel arrangement of FIGS. 7A and 7B. Such a pixel arrangement may improve space efficiency.

According to a pixel arrangement of the embodiments illustrated with respect to FIG. 12A, in the unit pixel area PXA, the second emission area EA2 of the second pixel PX2 and the third emission area EA3 of the third pixel PX3 may face each other in a diagonal direction, and one pair of sub-emission areas EA1*a* and EA1*b* of the first pixel PX1 may face each other in another diagonal direction. According to a pixel arrangement of the embodiments illustrated with respect to FIG. 12B, in the unit pixel area PXA, the first emission area EA1 of the first pixel PX1 and the third emission area EA3 of the third pixel PX3 may face each other in a diagonal direction, and one pair of sub-emission areas EA2*a* and EA2*b* of the second pixel PX2 may face each other in another diagonal direction.

Referring to FIG. 12A, the first to third emission areas EA1, EA2, and EA3 of the first to third pixels PX1, PX2, and PX3 may have circular shapes. The second emission area EA2 of the second pixel PX2 and the third emission area EA3 of the third pixel PX3 may have the same size (area), and a size of each of one pair of sub-emission areas EA1*a* and EA1*b* of the first pixel PX1 may be less than a size of each of the second emission area EA2 of the second pixel PX2 and the third emission area EA3 of the third pixel PX3. Sizes of one pair of sub-emission areas EA1*a* and EA1*b* of the first pixel PX1 may be the same. According to some embodiments, a size of the second emission area EA2 of the second pixel PX2 may be different from a size of the third emission area EA3 of the third pixel PX3.

Figure 12B:
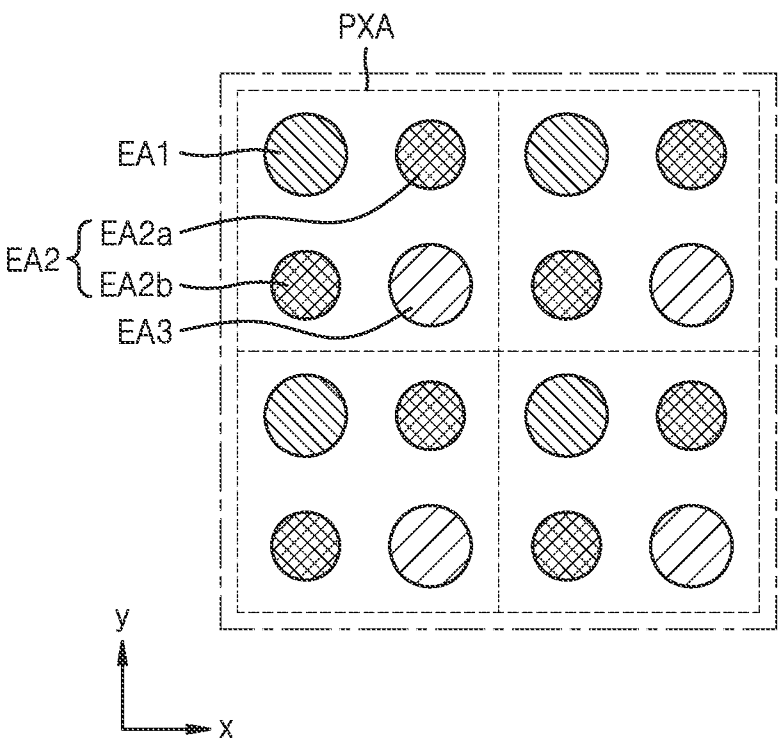

Referring to FIG. 12B, the first to third emission areas EA1, EA2, and EA3 of the first to third pixels PX1, PX2, and PX3 may have circular shapes. The first emission area EA1 of the first pixel PX1 and the third emission area EA3 of the third pixel PX3 may have the same size (area), and a size of each of one pair of sub-emission areas EA2*a* and EA2*b* of the second pixel PX2 may be less than a size of each of the first emission area EA1 of the first pixel PX1 and the third emission area EA3 of the third pixel PX3. Sizes of one pair of sub-emission areas EA2*a* and EA2*b* of the second pixel PX2 may be the same.

Figure 13:
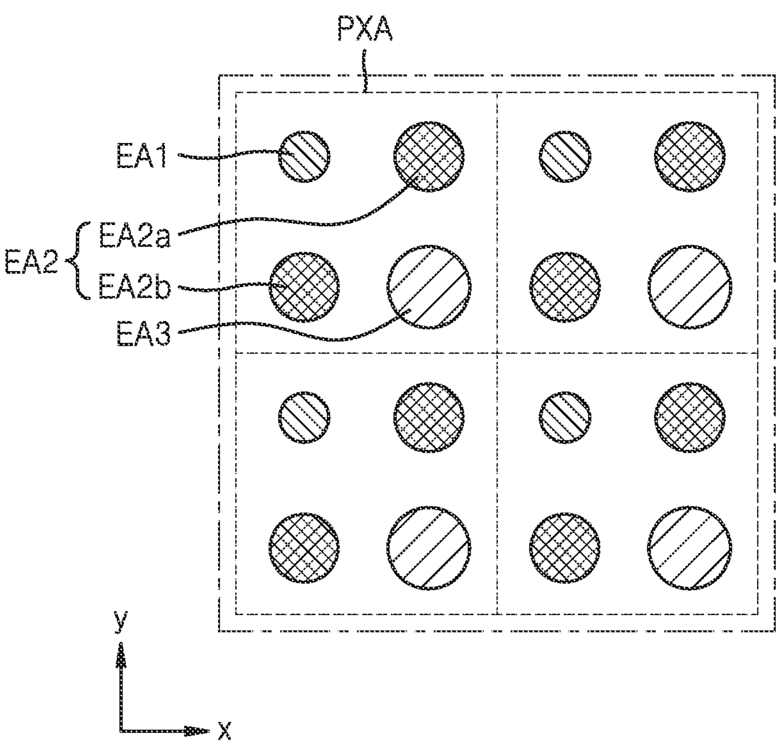

According to some embodiments, as shown in FIG. 13, the first emission area EA1 of the first pixel PX1 may have a smallest size, and the third emission area EA3 of the third pixel PX3 may have a largest size. A size of each of one pair of sub-emission areas EA2*a* and EA2*b* of the second pixel PX2 may be greater than a size of the first emission area EA1 of the first pixel PX1 and may be less than a size of the third emission area EA3 of the third pixel PX3.

According to some embodiments, diffraction may be minimized by increasing an aperture ratio of a pixel having a largest wavelength. For example, the first pixel PX1 that is a red pixel in a unit pixel area PXA may have a largest size.

Figure 14:
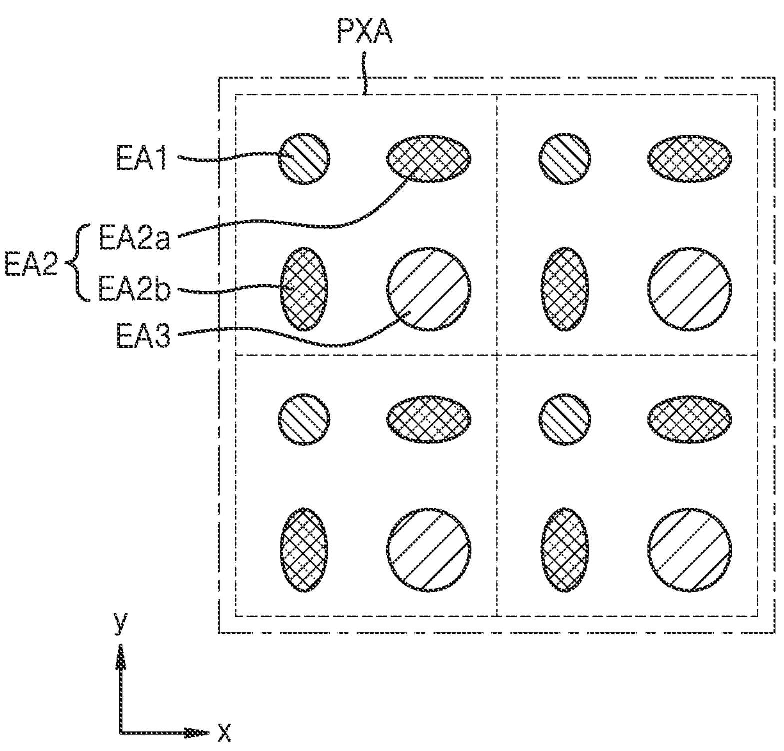
Figure 15:
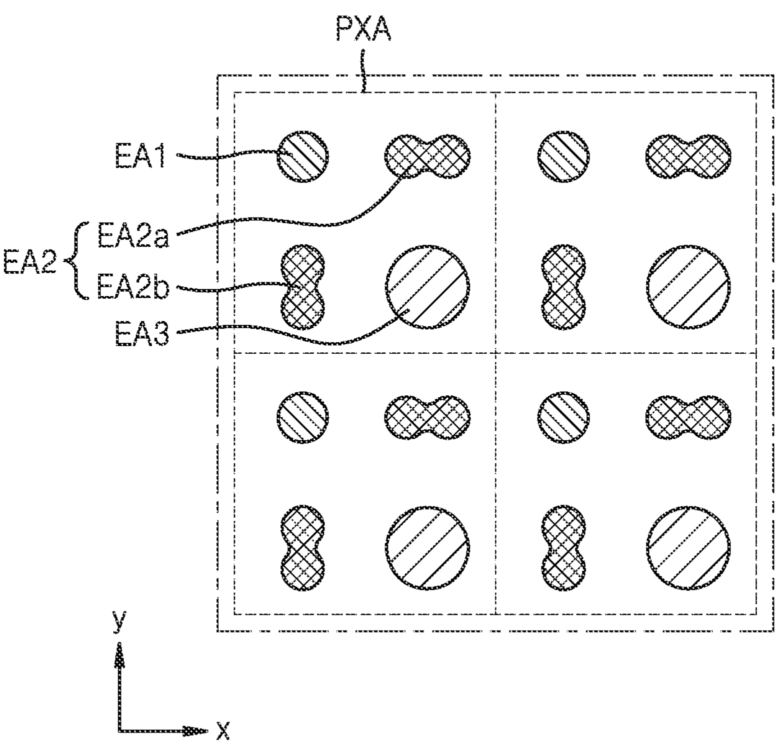

Referring to FIG. 14, the first emission area EA1 of the first pixel PX1 and the third emission area EA3 of the third pixel PX3 may have circular shapes, and one pair of sub-emission areas EA2*a* and EA2*b* of the second pixel PX2 may have elliptical shapes. A size of the third emission area EA3 of the third pixel PX3 may be greater than a size of the first emission area EA1 of the first pixel PX1. One of one pair of sub-emission areas EA2*a* and EA2*b* of the second pixel PX2 may have a longest diameter in the x direction and the other may have a longest diameter in the y direction. According to some embodiments, as shown in FIG. 15, one pair of sub-emission areas EA2*a* and EA2*b* of the second pixel PX2 may have dumbbell shapes.

Figure 16:
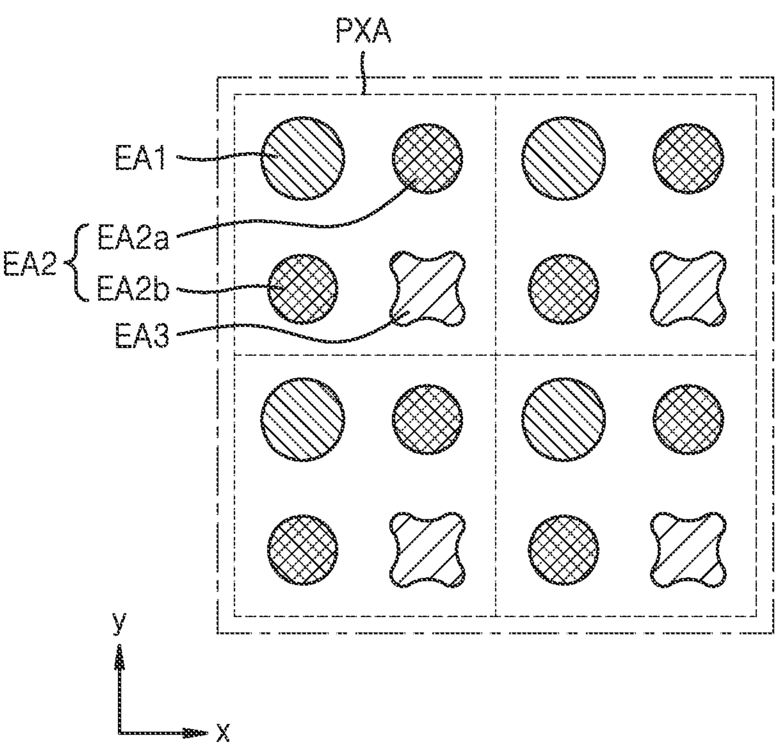
Figure 17:
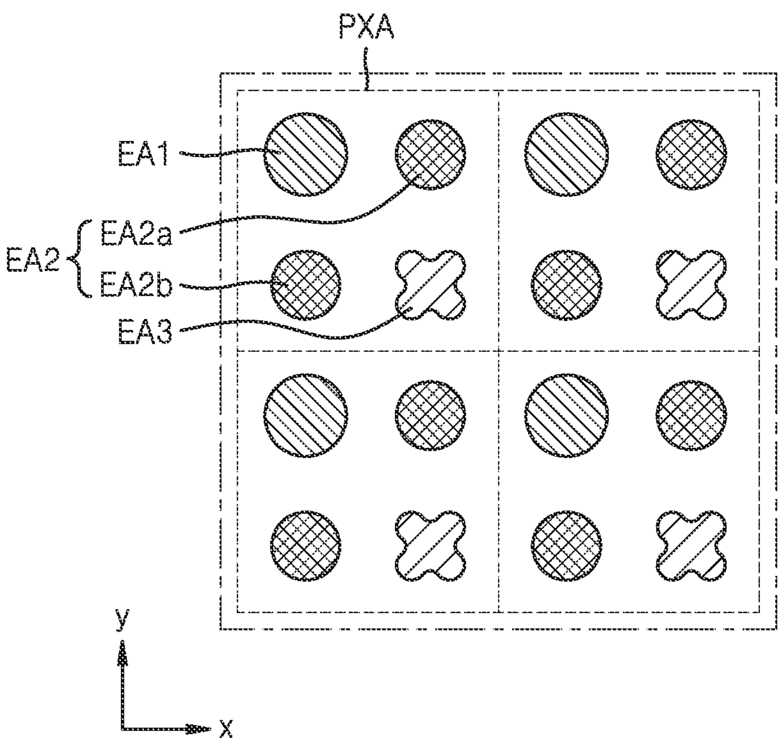

Referring to FIG. 16, the first emission area EA1 of the first pixel PX1 and one pair of sub-emission areas EA2*a* and EA2*b* of the second pixel PX2 may have circular shapes, and the third emission area EA3 of the third pixel PX3 may have an X-shaped closed curve shape. A size of the third emission area EA3 of the third pixel PX3 of FIG. 17 is less than a size of the third emission area EA3 of the third pixel PX3 of FIG. 16.

Figure 18:
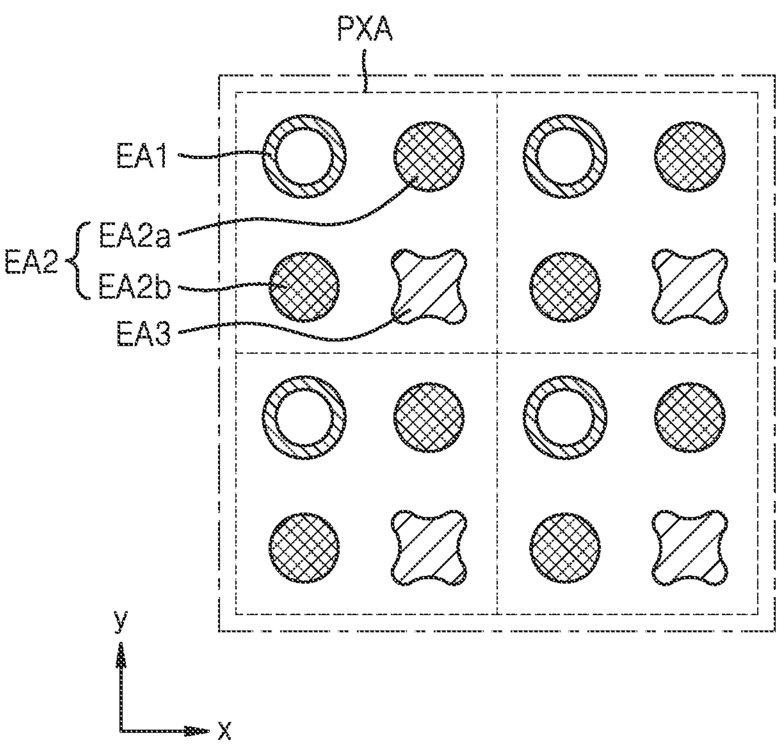
Figure 19:
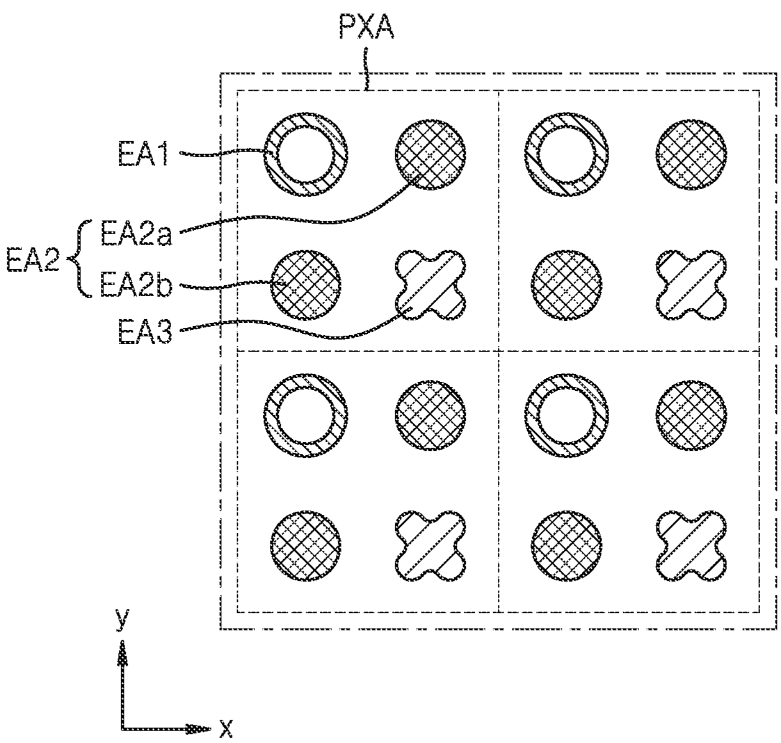

Referring to FIG. 18, the first emission area EA1 of the first pixel PX1 may have a ring shape (donut shape), one pair of sub-emission areas EA2*a* and EA2*b* of the second pixel PX2 may have circular shapes, and the third emission area EA3 of the third pixel PX3 may have an X-shaped closed curve shape. A size of the third emission area EA3 of the third pixel PX3 of FIG. 19 is less than a size of the third emission area EA3 of the third pixel PX3 of FIG. 18.

For convenience of explanation, FIGS. 13 to 19 are modifications illustrating that the second pixel PX2 includes one pair of sub-emission areas EA2*a* and EA2*b* as shown in FIG. 12B, but embodiments according to the present disclosure are not limited thereto. For example, in embodiments of FIGS. 12B to 19, locations of the second emission area EA2 of the second pixel PX2 and the third emission area EA3 of the third pixel PX3 may be changed with each other. In this case, the third emission area EA3 of the third pixel PX3 may include one pair of sub-emission areas EA3*a* and EA3*b*. Alternatively, modifications of FIGS. 13 to 19 may be applied, in a structure in which the first pixel PX1 includes one pair of sub-emission areas EA1*a* and EA1*b* as shown in the embodiments illustrated with respect to FIG. 12A.

Figure 20A:
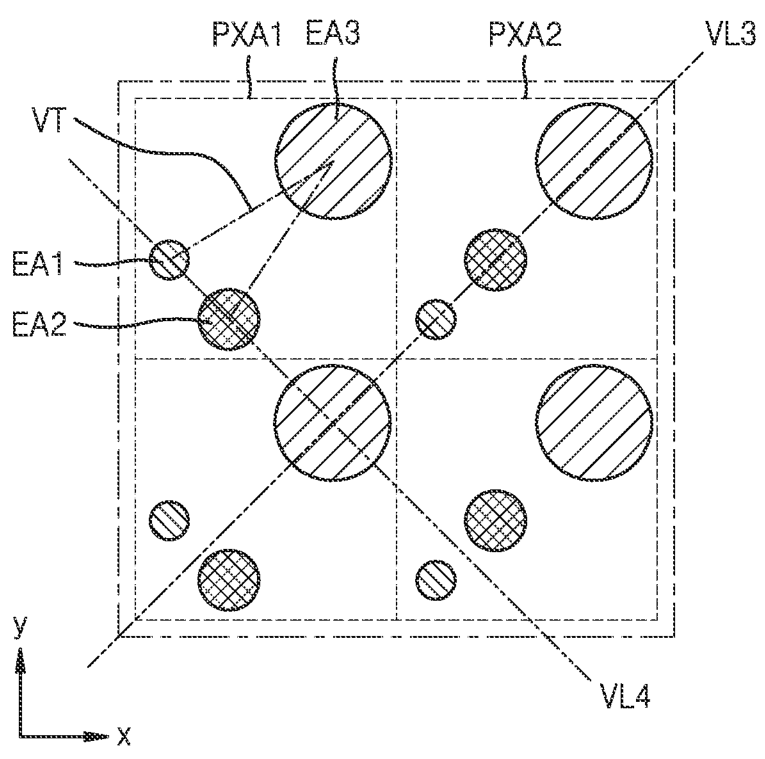
FIGS. 20A and 20B are views illustrating an arrangement of pixels, according to some embodiments.
Figure 20B:
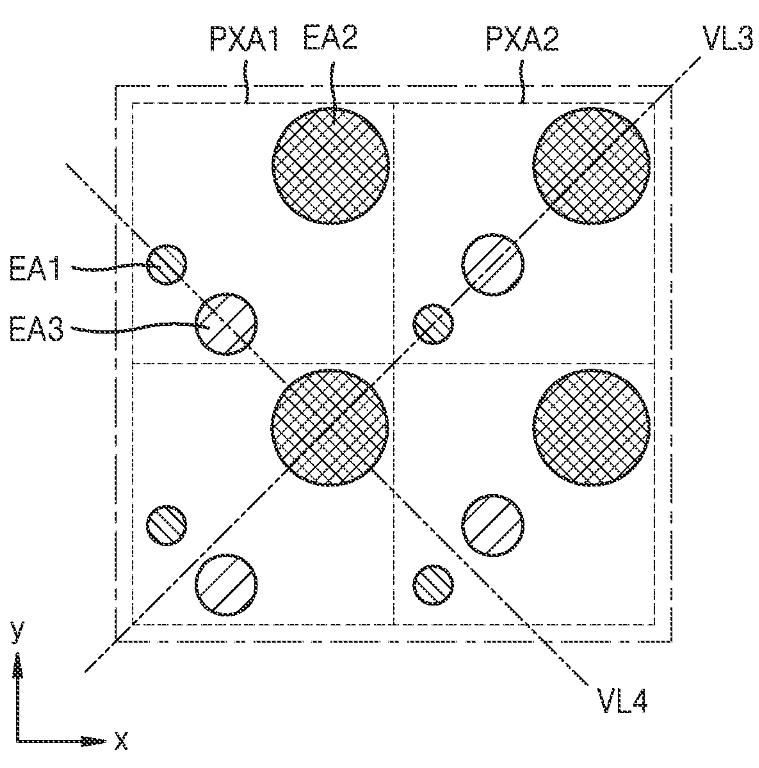

FIGS. 20A and 20B are views illustrating an arrangement of pixels, according to some embodiments.

Referring to FIG. 20A, in the display area DA, a first unit pixel area PXA1 and a second unit pixel area PXA2 may be alternately arranged in the x direction. In the first unit pixel area PXA1 and the second unit pixel area PXA2, an organic light-emitting diode of the first pixel PX1, an organic light-emitting diode of the second pixel PX2, and an organic light-emitting diode of the third pixel PX3 may be arranged in diagonal directions. The first emission area EA1 corresponding to the organic light-emitting diode of the first pixel PX1, the second emission area EA2 corresponding to the organic light-emitting diode of the second pixel PX2, and the third emission area EA3 corresponding to the organic light-emitting diode of the third pixel PX3 may have circular shapes. The first emission area EA1 may have a smallest radius, the third emission area EA3 may have a largest radius, and a radius of the second emission area EA2 may be greater than a radius of the first emission area EA1 and less than a radius of the third emission area EA3.

In the first unit pixel area PXA1, the first emission area EA1 of the first pixel PX1 and the second emission area EA2 of the second pixel PX2 may be located adjacent to each other along a fourth virtual straight line VL4 in a diagonal direction. The third emission area EA3 of the third pixel PX3 may be located adjacent to the first emission area EA1 of the first pixel PX1 and the second emission area EA2 of the second pixel PX2 along a third virtual straight line VL3 in a diagonal direction. In the first unit pixel area PXA1, centers of the first emission area EA1 of the first pixel PX1, the second emission area EA2 of the second pixel PX2, and the third emission area EA3 of the third pixel PX3 may be located at vertexes of a virtual triangle VT.

In the second unit pixel area PXA2, the second emission area EA2 of the second pixel PX2 may be located between the first emission area EA1 of the first pixel PX1 and the third emission area EA3 of the third pixel PX3. In the second unit pixel area PXA2, centers of the first emission area EA1 of the first pixel PX1, the second emission area EA2 of the second pixel PX2, and the third emission area EA3 of the third pixel PX3 may be sequentially located on the third virtual straight line VL3.

According to some embodiments, as shown in FIG. 20B, locations of the second pixel PX2 and the third pixel PX3 in a pixel arrangement of FIG. 20A may be changed with each other. In the first unit pixel area PXA1, the first emission area EA1 of the first pixel PX1 and the third emission area EA3 of the third pixel PX3 may be located adjacent to each other along the fourth virtual straight line VL4, and the second emission area EA2 of the second pixel PX2 may be located adjacent to the first emission area EA1 of the first pixel PX1 and the second emission area EA2 of the second pixel PX2 along the third virtual straight line VL3.

In the second unit pixel area PXA2, the first emission area EA1 of the first pixel PX1, the third emission area EA3 of the third pixel PX3, and the second emission area EA2 of the second pixel PX2 may be sequentially located adjacent to each other along the third virtual straight line VL3. The first emission area EA1 may have a smallest radius, the second emission area EA2 may have a largest radius, and a radius of the third emission area EA3 may be greater than a radius of the first emission area EA1 and less than a radius of the second emission area EA2.

FIGS. 21A to 27B are views illustrating various modifications of a pixel arrangement of FIGS. 20A and 20B. According to some embodiments, in the unit pixel area PXA, an emission area of at least one of pixels other than a pixel having a largest aperture ratio may have an arc closed curve shape. In the unit pixel area PXA, when emission areas of two pixels have arc closed curve shapes, arc centers may be the same (matched) or may not be the same.

Figure 21A:
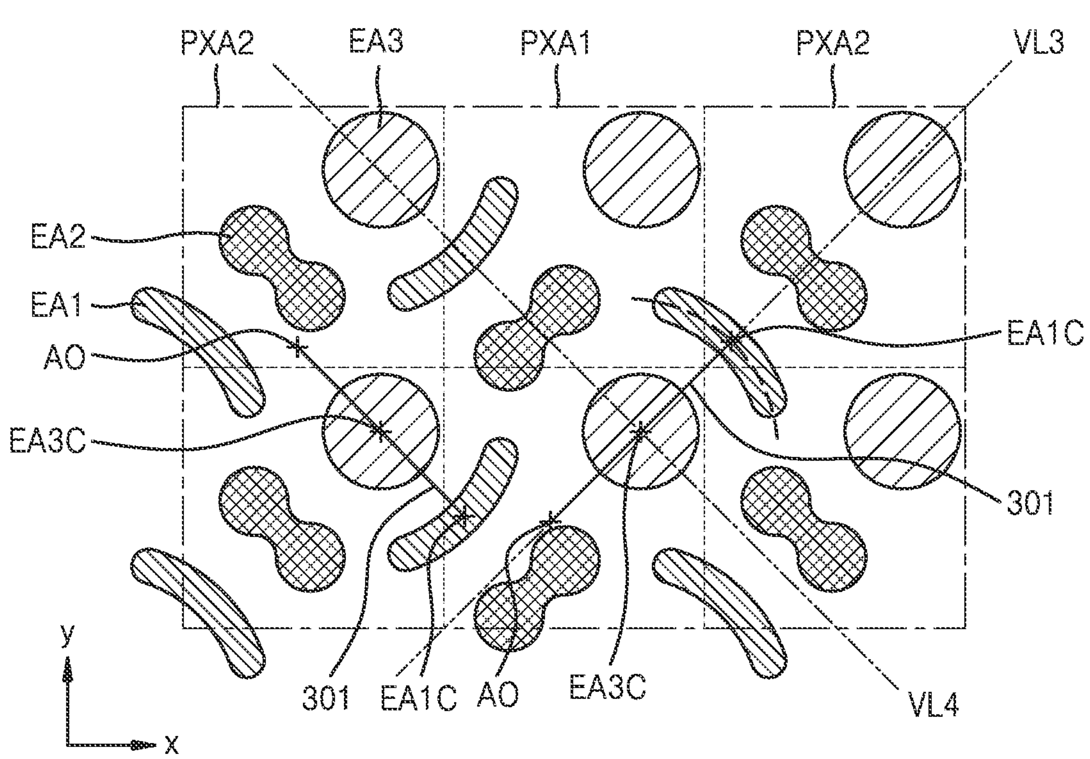
FIGS. 21A to 27B are views illustrating various modifications of a pixel arrangement of FIGS. 20A and 20B, according to some embodiments.
Figure 21B:
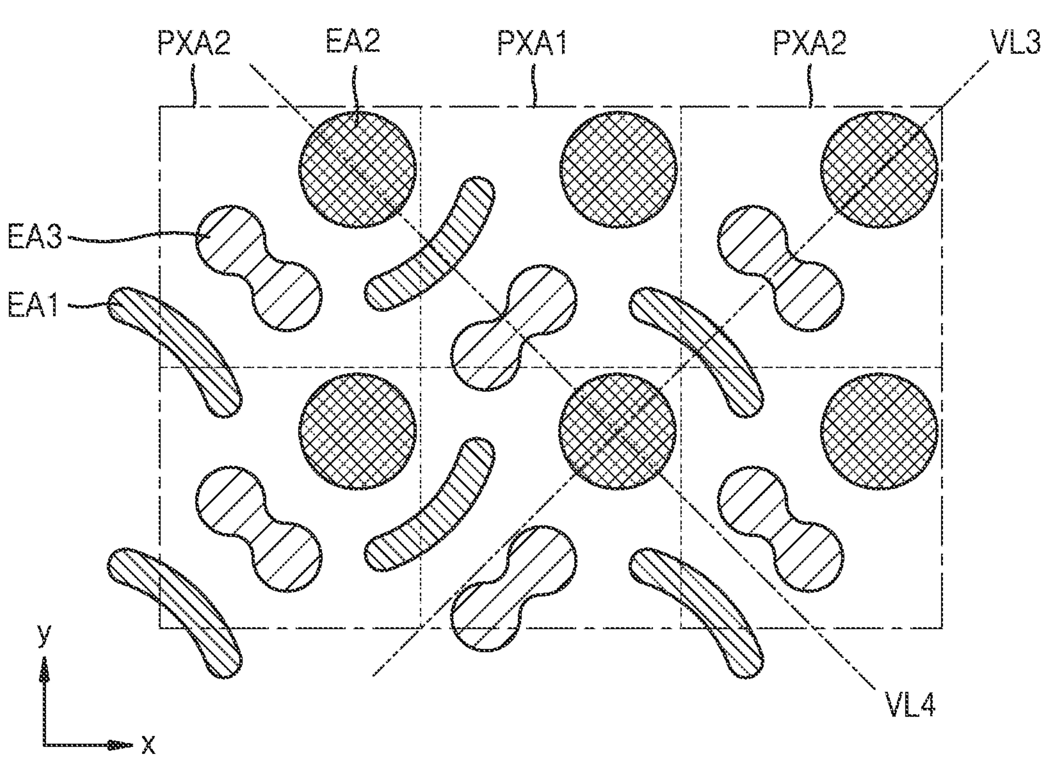

Referring to FIG. 21A, in the first unit pixel area PXA1 and the second unit pixel area PXA2, the third emission area EA3 of the third pixel PX3 may be located in a corresponding unit pixel area, and each of the first emission area EA1 of the first pixel PX1 and the second emission area EA2 of the second pixel PX2 may be partially located in an adjacent unit pixel area beyond a corresponding unit pixel area. FIG. 21B is a modification in which locations of the second emission area EA2 of the second pixel PX2 and the third emission area EA3 of the third pixel PX3 in the embodiments illustrated with respect to FIG. 21A are changed with each other.

In the first unit pixel area PXA1 and the second unit pixel area PXA2, the third emission area EA3 of the third pixel PX3 may have a circular shape, the first emission area EA1 of the first pixel PX1 may have an arc shape having a certain width and convex both ends, and the second emission area EA2 of the second pixel PX2 may have a dumbbell shape. In the first unit pixel area PXA1, an arc center of the first emission area EA1 may be located on the fourth virtual straight line VL4. In the first unit pixel area PXA1, the second emission area EA2 of the second pixel PX2 may extend in an extension direction of the third virtual straight line VL3. In the second unit pixel area PXA2, an arc center of the first emission area EA1 may be located on the third virtual straight line VL3. In the second unit pixel area PXA2, the second emission area EA2 of the second pixel PX2 may extend in an extension direction of the fourth virtual straight line VL4.

According to some embodiments, a line 301 connecting a center EA1C of the first emission area EA1 to an arc center AO of the first emission area EA1 may pass through a center EA3C of an adjacent third emission area EA3 having a circular shape. In the first unit pixel area PXA1, the straight line 301 connecting the center EA1C of the first emission area EA1 to an arc center AO of the first emission area EA1 may pass through a center EA3C of an adjacent third emission area EA3 in the second unit pixel area PXA2. The straight line 301 connecting the center EA1C of the first emission area EA1 to the arc center AO of the first emission area EA1 in the second unit pixel area PXA2 may pass through the center EA3C of an adjacent third emission area EA3 in the first unit pixel area PXA1. According to some embodiments, the straight line 301 connecting the center EA1C of the first emission area EA1 to the arc center AO of the first emission area EA1 may not pass through the center EA3C of an adjacent third emission area EA3 having a circular shape.

Figure 22A:
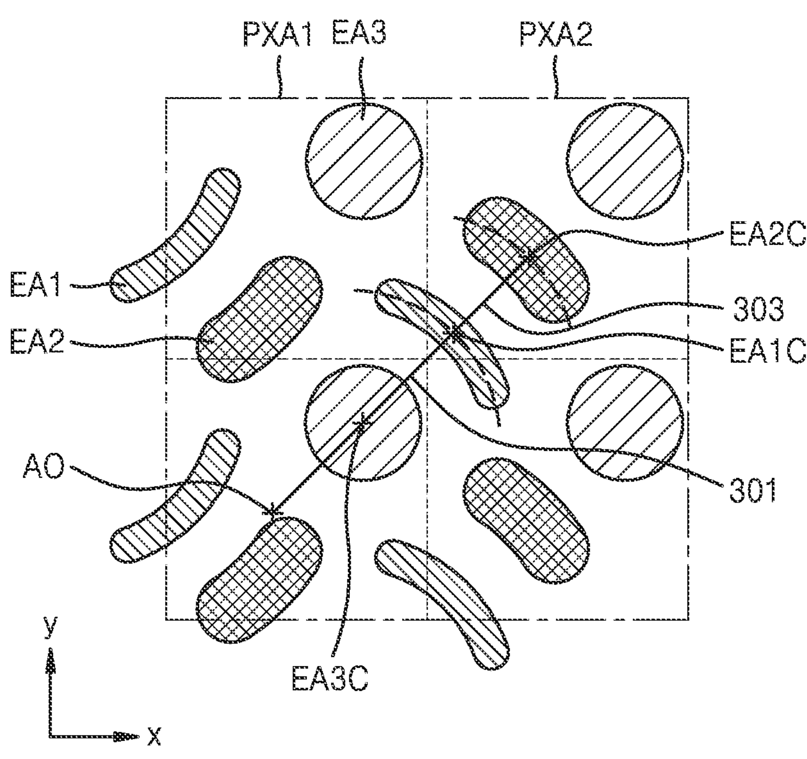

FIG. 22A is a modification in which a shape of the second emission area EA2 of the second pixel PX2 and a shape of the first emission area EA1 of the first pixel PX1 are the same in the embodiments illustrated with respect to FIG. 21A. The second emission area EA2 of the second pixel PX2 may have an arc shape having a certain width and convex both ends. A width of the second emission area EA2 of the second pixel PX2 may be greater than a width of the first emission area EA1 of the first pixel PX1. An arc length of the first emission area EA1 of the first pixel PX1 may be greater than an arc length of the second emission area EA2 of the second pixel PX2. A straight line 303 connecting a center EA2C of the second emission area EA2 to an arc center AO of the second emission area EA2 and a straight line 301 connecting a center EA1C of the first emission area EA1 to an arc center AO of the first emission area EA1 may overlap each other.

Figure 22B:
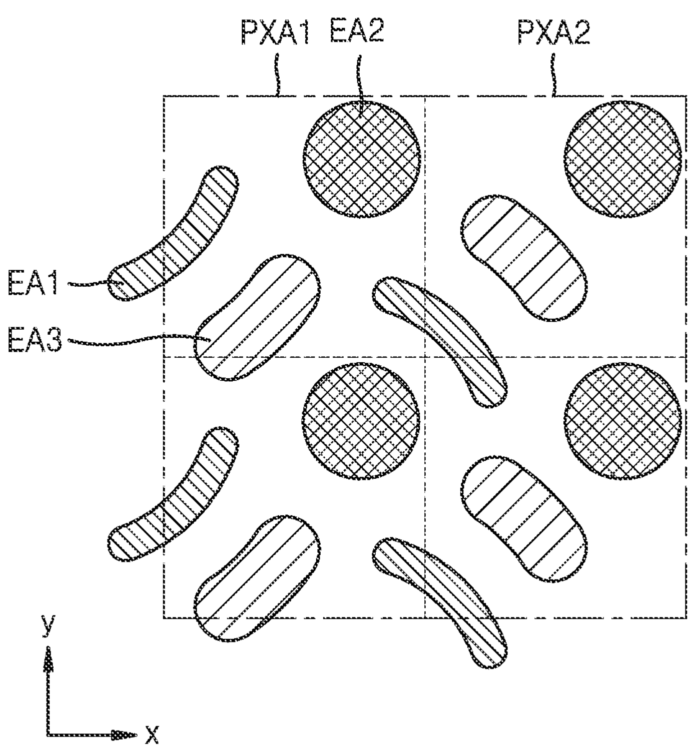

According to some embodiments, the straight lines 301 and 303 may pass through a center EA3C of an adjacent third emission area EA3 having a circular shape. According to some embodiments, the straight lines 301 and 303 may be offset without overlapping each other. The straight line 301 and/or the straight line 303 may not pass through the center EA3C of the adjacent third emission area EA3 having a circular shape. A size of the second emission area EA2 of the second pixel PX2 may be greater than a size of the first emission area EA1 of the first pixel PX1. FIG. 22B is a modification in which locations of the second emission area EA2 of the second pixel PX2 and the third emission area EA3 of the third pixel PX3 are changed with each other in the embodiments illustrated with respect to FIG. 22A.

Figure 23A:
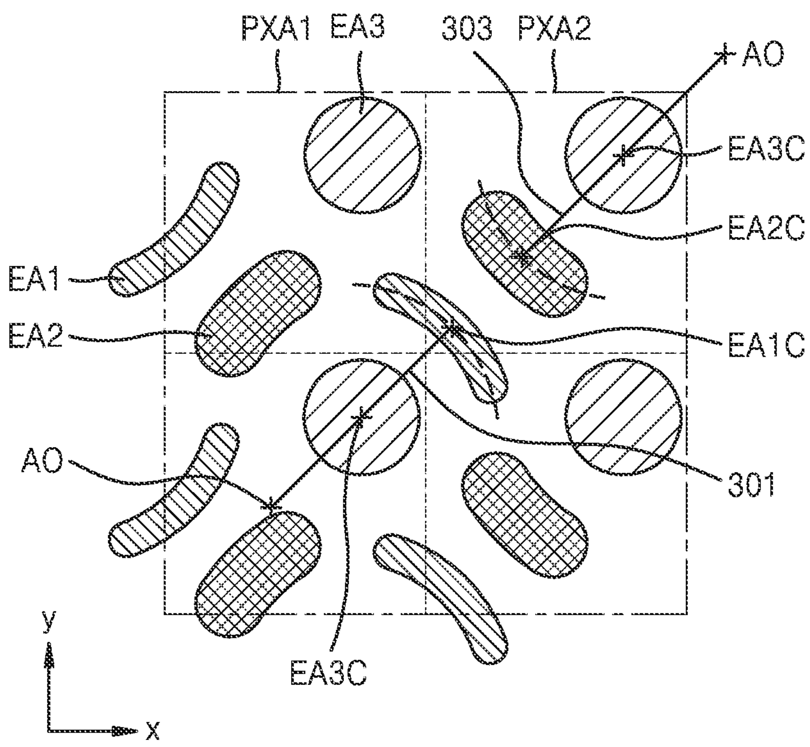
Figure 23B:
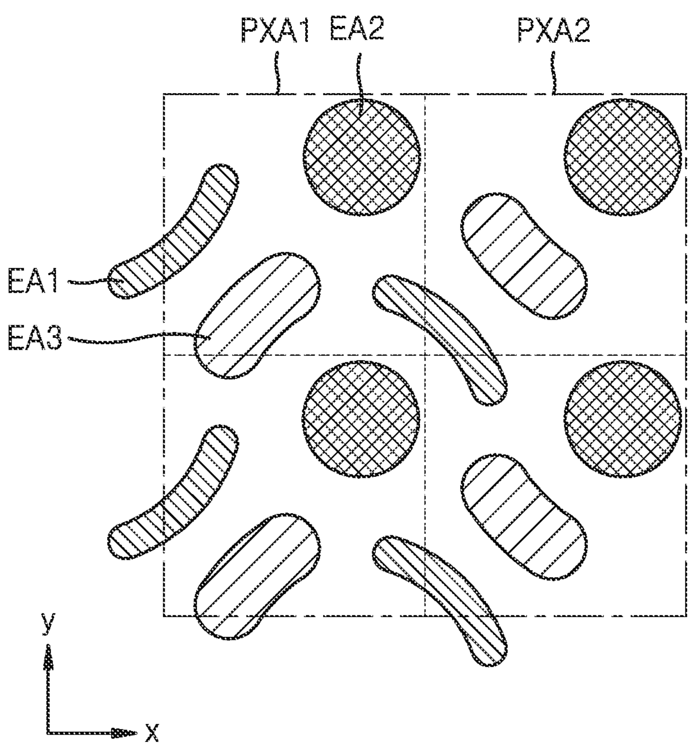

FIG. 23A is a modification in which a curved direction of the second emission area EA2 of the second pixel PX2 is opposite to a curved direction of the first emission area EA1 of the first pixel PX1 in the embodiments illustrated with respect to FIG. 22A. A straight line 303 connecting a center EA2C of the second emission area EA2 to an arc center AO of the second emission area EA2 and a straight line 301 connecting a center EA1C of the first emission area EA1 to an arc center AO of the first emission area EA1 may not overlap each other. FIG. 23B is a modification in which locations of the second emission area EA2 of the second pixel PX2 and the third emission area EA3 of the third pixel PX3 are changed with each other in the embodiments illustrated with respect to FIG. 23A.

Figure 24A:
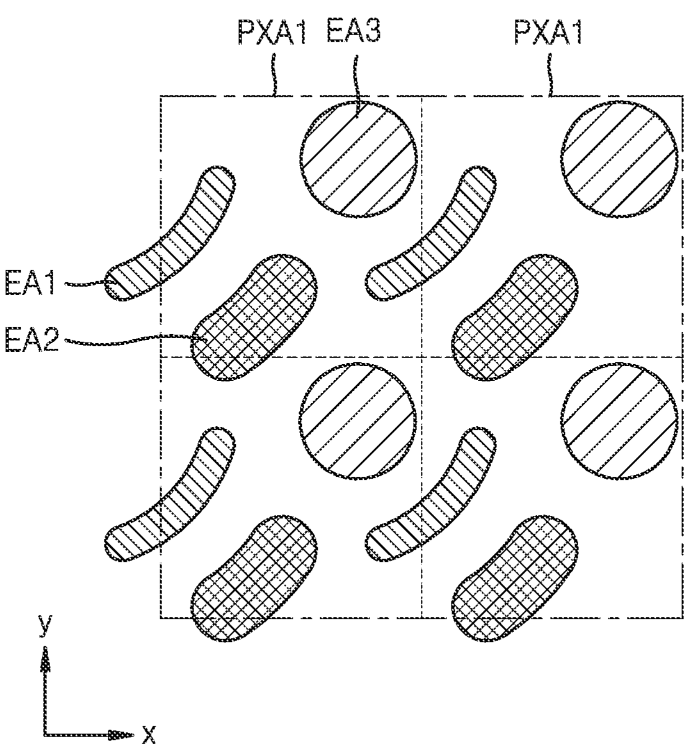
Figure 24B:
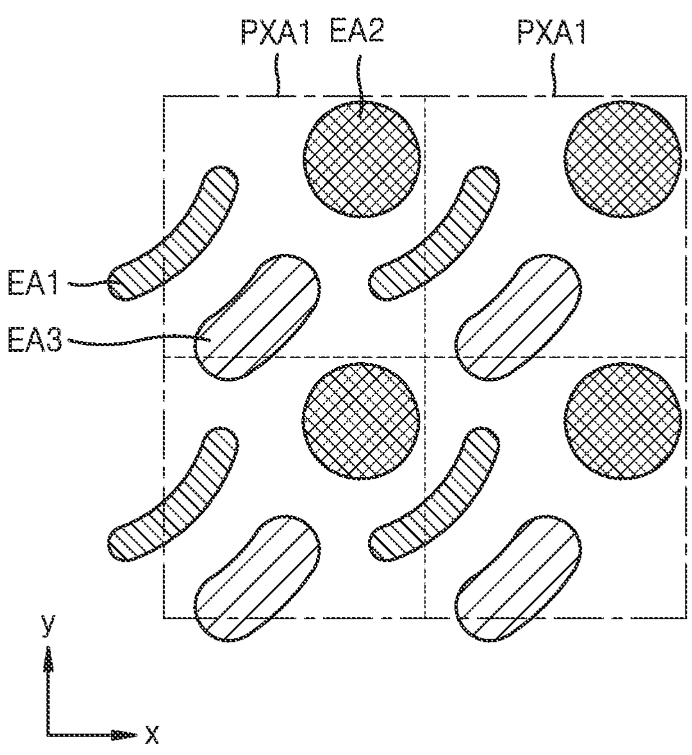

FIG. 24A is a modification in which the first emission area EA1 of the first pixel PX1, the second emission area EA2 of the second pixel PX2, and the third emission area EA3 of the third pixel PX3 in the first unit pixel area PXA1 are repeatedly arranged in the x direction and the y direction in the embodiments illustrated with respect to FIG. 22A. FIG. 24B is a modification in which locations of the second emission area EA2 of the second pixel PX2 and the third emission area EA3 of the third pixel PX3 are changed with each other in the embodiments illustrated with respect to FIG. 24A.

Figure 25A:
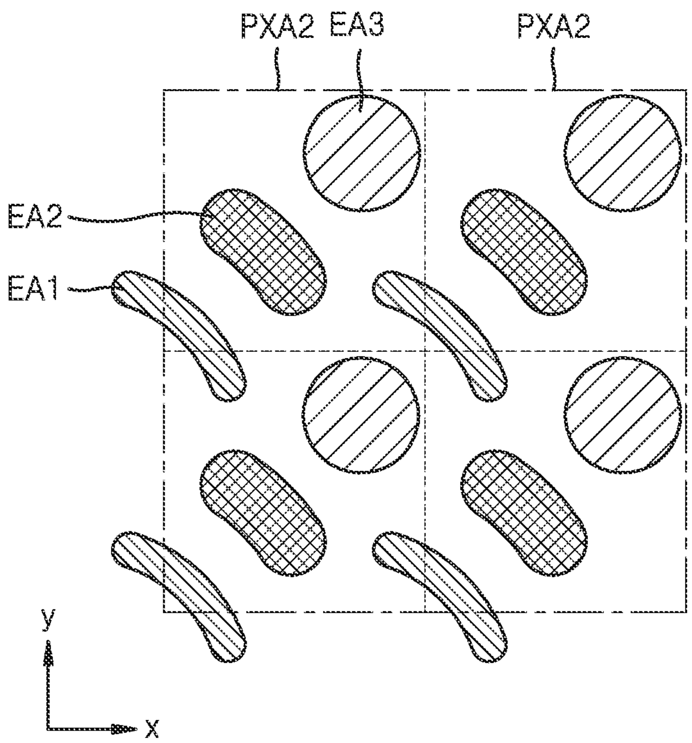
Figure 25B:
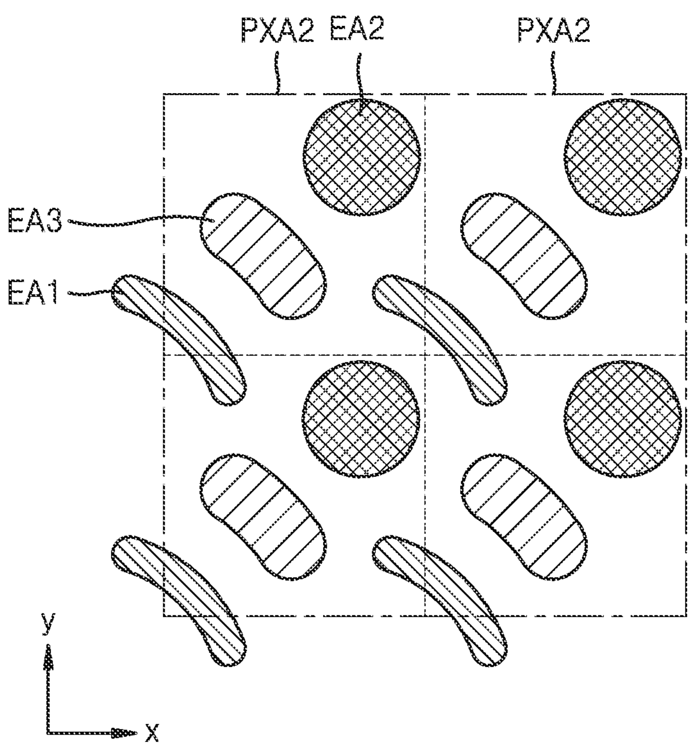

FIG. 25A is a modification in which the first emission area EA1 of the first pixel PX1, the second emission area EA2 of the second pixel PX2, and the third emission area EA3 of the third pixel PX3 in the second unit pixel area PXA2 are repeatedly arranged in the x direction and the y direction in the embodiments illustrated with respect to FIG. 22A. FIG. 25B is a modification in which locations of the second emission area EA2 of the second pixel PX2 and the third emission area EA3 of the third pixel PX3 are changed with each other in the embodiments illustrated with respect to FIG. 25A.

Figure 26A:
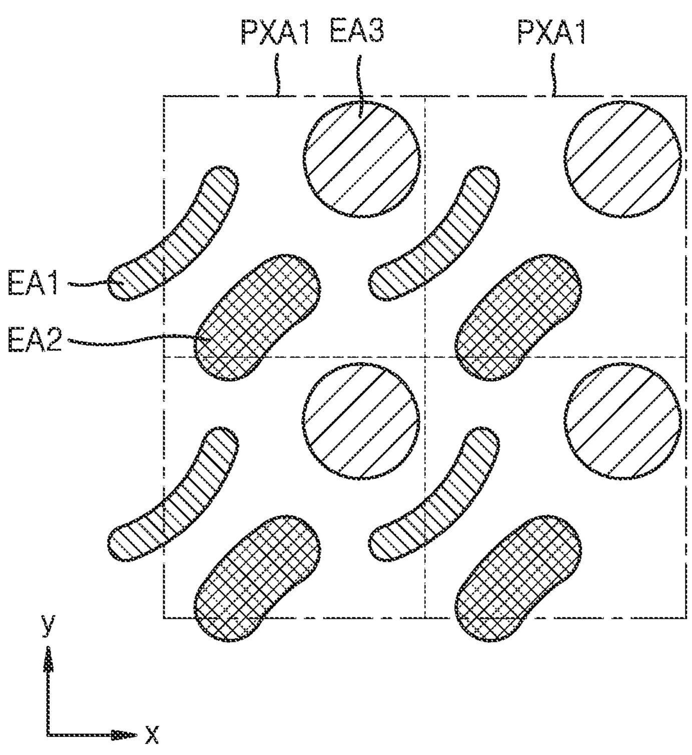
Figure 26B:
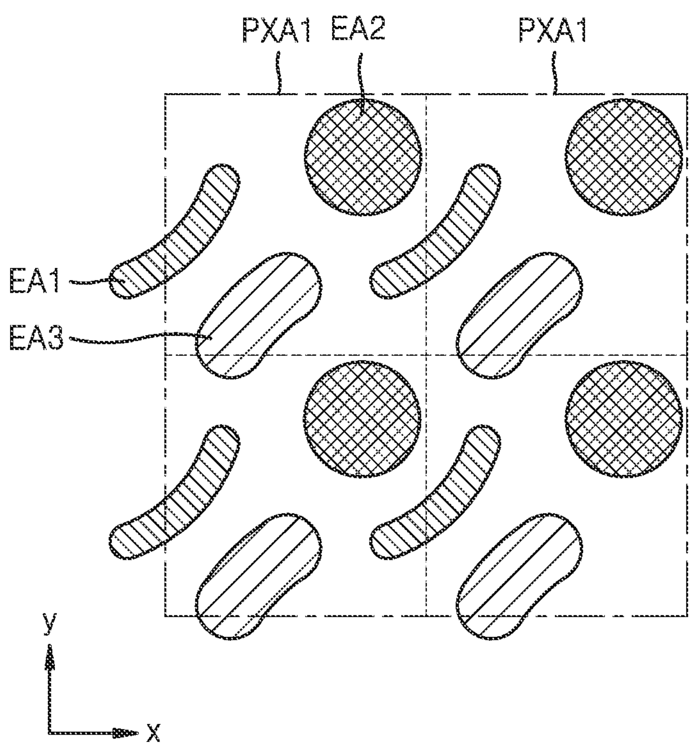

FIG. 26A is a modification in which the first emission area EA1 of the first pixel PX1, the second emission area EA2 of the second pixel PX2, and the third emission area EA3 of the third pixel PX3 in the first unit pixel area PXA1 are repeatedly arranged in the x direction and the y direction in the embodiments illustrated with respect to FIG. 23A. FIG. 26B is a modification in which locations of the second emission area EA2 of the second pixel PX2 and the third emission area EA3 of the third pixel PX3 are changed with each other in the embodiments illustrated with respect to FIG. 26A.

Figure 27A:
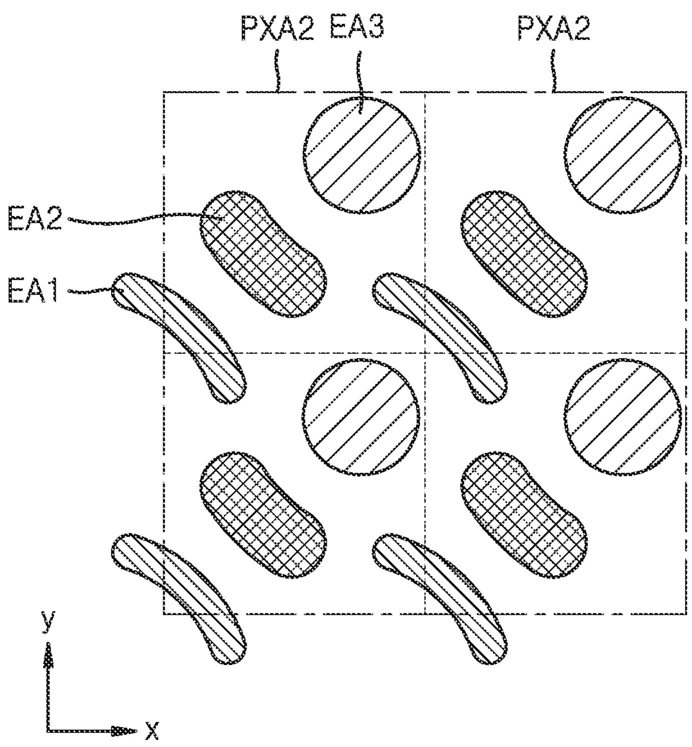
Figure 27B:
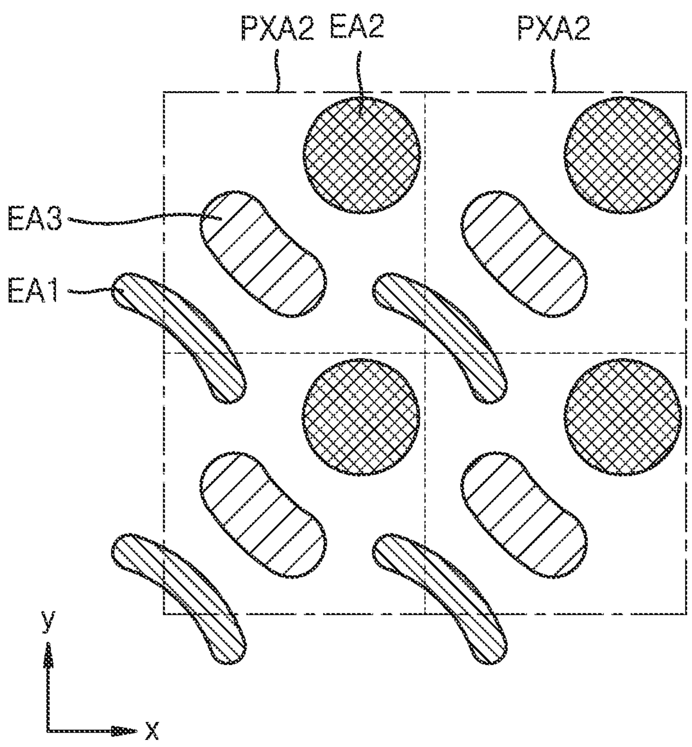

FIG. 27A is a modification in which the first emission area EA1 of the first pixel PX1, the second emission area EA2 of the second pixel PX2, and the third emission area EA3 of the third pixel PX3 in the second unit pixel area PXA2 are repeatedly arranged in the x direction and the y direction in the embodiments illustrated with respect to FIG. 23A. FIG. 27B is a modification in which locations of the second emission area EA2 of the second pixel PX2 and the third emission area EA3 of the third pixel PX3 are changed with each other in the embodiments illustrated with respect to FIG. 27A.

Because an emission area according to some embodiments has a shape in which a straight line is minimized or reduced and an edge is curved, reflective color bands and diffraction in an image may be minimized.

In the above, a display apparatus including an organic light-emitting diode as a display element has been described for convenience of explanation. However, embodiments may be applied to any of various types of display apparatuses such as a liquid crystal display apparatus, an electrophoretic display apparatus, and an inorganic EL display apparatus.

A display apparatus according to embodiments may be implemented as an electronic device such as a smartphone, a mobile phone, a smart watch, a navigation device, a game console, a TV, a vehicle head unit, a notebook computer, a laptop computer, a tablet computer, a personal media player (PMP), or a personal digital assistant (PDA). Also, the electronic device may be a flexible device.

According to embodiments, because an emission area has a closed curve shape, a display apparatus in which an aperture ratio loss may be minimized or reduced and display quality may be relatively improved may be provided. However, the scope of embodiments according to the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display panel comprising:

a plurality of unit pixel areas defined by areas where a first direction and a second direction intersect, the second direction being perpendicular to the first direction, wherein, in each of the unit pixel areas, a first display element configured to emit light of a first color and a second display element configured to emit light of a second color are located adjacent to each other in the first direction, and a third display element configured to emit light of a third color is located adjacent to the first display element and the second display element in the second direction, wherein a first emission area corresponding to the first display element, a second emission area corresponding to the second display element, and a third emission area corresponding to the third display element have closed curve shapes, and wherein among two adjacent unit pixel areas along the second direction, centers of the first emission areas are aligned with each other along the second direction, centers of the second emission areas are aligned with each other along the second direction, and when the third emission area comprises only one emission area, centers of the third emission areas are offset from each other along the second direction, or when the third emission area comprises a first sub-emission area and a second sub-emission area, a middle point between the first sub-emission area and the second sub-emission area of one of the two adjacent unit pixel areas, as measured along the first direction, is offset from a middle point between the first sub-emission area and the second sub-emission area of another of the two adjacent unit pixel areas, along the second direction.

2. The display panel of claim 1, wherein when the third emission area comprises first sub-emission area and the second sub-emission area that are adjacent to each other in the first direction, wherein the first emission area, the second emission area, and the third emission area have circular shapes.

3. The display panel of claim 1, wherein the first emission area, the second emission area, and the third emission area have non-circular closed curve shapes.

4. The display panel of claim 1, wherein the first color is red, the second color is green, and the third color is blue.

5. The display panel of claim 1, wherein the first color is red, the second color is blue, and the third color is green.

6. A display panel comprising:

a plurality of unit pixel areas defined by areas where a first direction and a second direction intersect, the second direction being perpendicular to the first direction, wherein, in each of the unit pixel areas, a first display element configured to emit light of a first color, a second display element configured to emit light of a second color, and a third display element configured to emit light of a third color are arranged according to certain rules, wherein a first emission area corresponding to the first display element, a second emission area corresponding to the second display element, and a third emission area corresponding to the third display element have closed curve shapes, and wherein among two adjacent unit pixel areas along the second direction, centers of the first emission areas are aligned with each other along the second direction, centers of the second emission areas are aligned with each other along the second direction, and when the third emission area comprises only one emission area, centers of the third emission areas are offset from each other along the second direction, or when the third emission area comprises a first sub-emission area and a second sub-emission area, a middle point between the first sub-emission area and the second sub-emission area of one of the two adjacent unit pixel areas, as measured along the first direction, is offset from a middle point between the first sub-emission area and the second sub-emission area of another of the two adjacent unit pixel areas, along the second direction.

7. The display panel of claim 6, wherein one of the first display element, the second display element, and the third display element comprises a first sub-display element and a second sub-display element, wherein a first sub-emission area corresponding to the first sub-display element and a second sub-emission area corresponding to the second sub-display element are adjacent to each other in the first direction or a diagonal direction.

* * * * *